US010627800B2

(12) United States Patent
Kuwahara

(10) Patent No.: US 10,627,800 B2
(45) Date of Patent: Apr. 21, 2020

(54) SUBSTRATE TRANSPORT DEVICE, SUBSTRATE PROCESSING APPARATUS INCLUDING THE SUBSTRATE TRANSPORT DEVICE, AND SUBSTRATE TRANSPORT METHOD

(71) Applicant: SCREEN Holdings Co., Ltd., Kyoto (JP)

(72) Inventor: Joji Kuwahara, Kyoto (JP)

(73) Assignee: SCREEN Holdings, Co., Ltd. (JP)

(*) Notice: Subject to any disclaimer, the term of this patent is extended or adjusted under 35 U.S.C. 154(b) by 165 days.

(21) Appl. No.: 15/861,716

(22) Filed: Jan. 4, 2018

(65) Prior Publication Data
US 2018/0231952 A1 Aug. 16, 2018

(30) Foreign Application Priority Data

Feb. 14, 2017 (JP) .................................. 2017-025350

(51) Int. Cl.
*G05B 19/19* (2006.01)
*G05B 19/418* (2006.01)
(Continued)

(52) U.S. Cl.
CPC ......... *G05B 19/19* (2013.01); *G05B 19/4189* (2013.01); *H01L 21/67155* (2013.01); *H01L 21/67703* (2013.01); *Y02P 90/02* (2015.11)

(58) Field of Classification Search
CPC .................................................. G05B 19/4189
See application file for complete search history.

(56) References Cited

U.S. PATENT DOCUMENTS 4,587,002 A * 5/1986 Bok ........................ B65G 51/03
118/50.1
5,831,851 A * 11/1998 Eastburn ............ G05B 19/4184
700/114
(Continued)

FOREIGN PATENT DOCUMENTS

EP        2719500 A1 * 4/2014  ......... B23Q 17/2428
JP      2008-311303 A    12/2008
(Continued)

OTHER PUBLICATIONS

Office Action dated Dec. 7, 2018 in corresponding Patent Application No. 106144945.
(Continued)

*Primary Examiner* — Jennifer L Norton
(74) *Attorney, Agent, or Firm* — Ostrolenk Faber LLP

(57) ABSTRACT

A portion position calculator calculates positions of first to fifth portions of a substrate on a hand based on detection signals of first to fifth detectors. An imaginary circle calculator calculates four different imaginary circles based on the positions of the first to fourth portions, respectively, to calculate a center position of each imaginary circle. A substrate position determiner calculates a plurality of amounts of deviation among the plurality of center positions. When all of the plurality of amounts of deviation are not more than a threshold value, the substrate position determiner determines a position of the substrate on the hand based on any or all of the four imaginary circles. When at least one of the plurality of amounts of deviation exceeds the threshold value, the substrate position determiner selects an imaginary circle of the four imaginary circles, which passes through the position of the fifth portion, and determines the position of the substrate on the hand based on the selected
(Continued)

imaginary circle. A substrate transport operation is controlled based on a result of the determination.

9 Claims, 16 Drawing Sheets

(51) Int. Cl.
 *H01L 21/67* (2006.01)
 *H01L 21/677* (2006.01)

(56) References Cited

U.S. PATENT DOCUMENTS

| | | | | |
|---|---|---|---|---|
| 5,882,413 | A * | 3/1999 | Beaulieu | C23C 14/566 118/719 |
| 7,518,708 | B2 * | 4/2009 | Emoto | G03F 7/70341 355/67 |
| 9,488,975 | B2 * | 11/2016 | Chakravarth | G05B 19/41865 |
| 10,112,205 | B2 * | 10/2018 | Inagaki | B05B 9/03 |
| 10,239,707 | B2 * | 3/2019 | Caveney | H01L 21/67173 |
| 2007/0065144 | A1 | 3/2007 | Hofmeister et al. | 396/611 |
| 2007/0216179 | A1 * | 9/2007 | Hirooka | H01L 21/68707 294/103.1 |
| 2008/0131237 | A1 * | 6/2008 | van der Meulen | B65G 25/02 414/217 |
| 2010/0172720 | A1 | 7/2010 | Kondoh | 414/217 |
| 2012/0046904 | A1 | 2/2012 | Hayashi et al. | |
| 2012/0224945 | A1 | 9/2012 | Douki et al. | 414/758 |
| 2012/0257176 | A1 | 10/2012 | Hayashi | 355/27 |
| 2013/0204421 | A1 | 8/2013 | Hayashi et al. | 700/112 |
| 2014/0023776 | A1 | 1/2014 | Kuwahara et al. | 427/8 |
| 2014/0065309 | A1 * | 3/2014 | Kashiyama | G03F 7/16 427/331 |
| 2014/0234991 | A1 | 8/2014 | Douki et al. | 438/5 |
| 2016/0189390 | A1 | 6/2016 | Hayashi | |
| 2017/0018444 | A1 | 1/2017 | Hayashi et al. | |
| 2018/0061692 | A1 * | 3/2018 | Nishino | H01L 21/67745 |

FOREIGN PATENT DOCUMENTS

| | | |
|---|---|---|
| JP | 2009-071008 A | 4/2009 |
| JP | 2012-182393 A | 9/2012 |
| JP | 2014-022589 A | 2/2014 |
| KR | 10-2012-0023517 A | 3/2012 |
| KR | 10-2012-0115938 A | 10/2012 |
| KR | 10-2013-0090346 A | 8/2013 |
| KR | 10-2016-0078243 A | 7/2016 |
| TW | 200714537 A | 4/2007 |
| TW | 201409601 A | 3/2014 |

OTHER PUBLICATIONS

Decision to Grant a Patent dated Sep. 5, 2019 in corresponding Korean Patent Application No. 10-2018-0011361.

* cited by examiner

F I G. 6
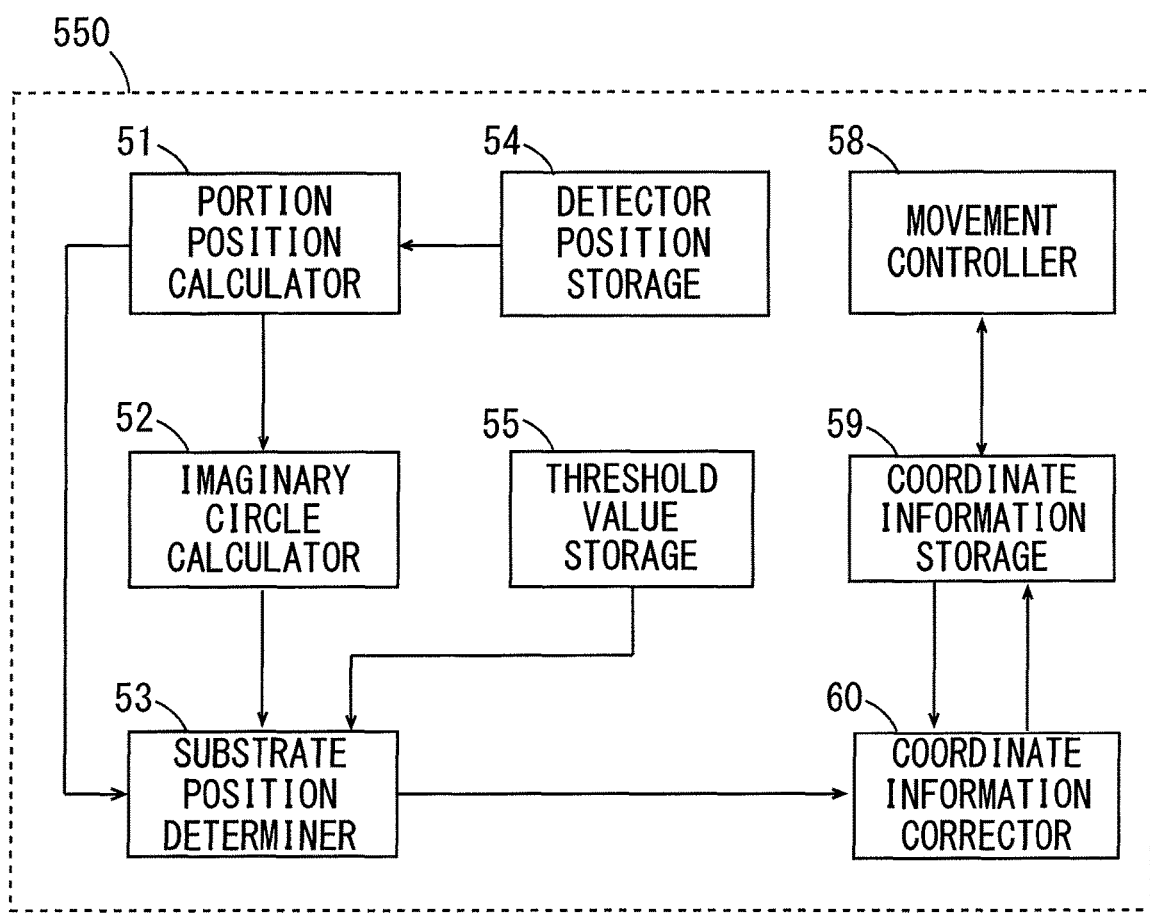

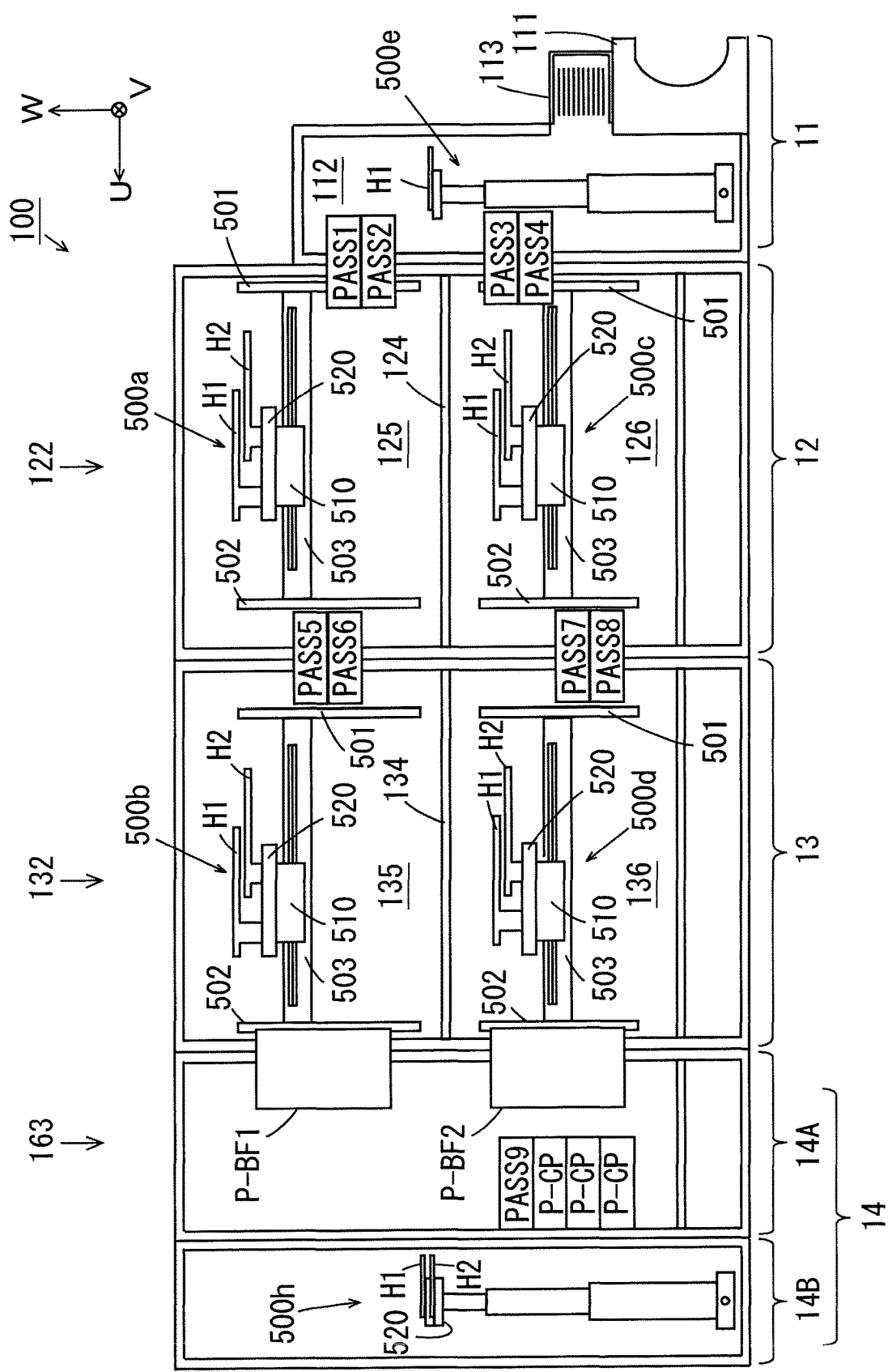

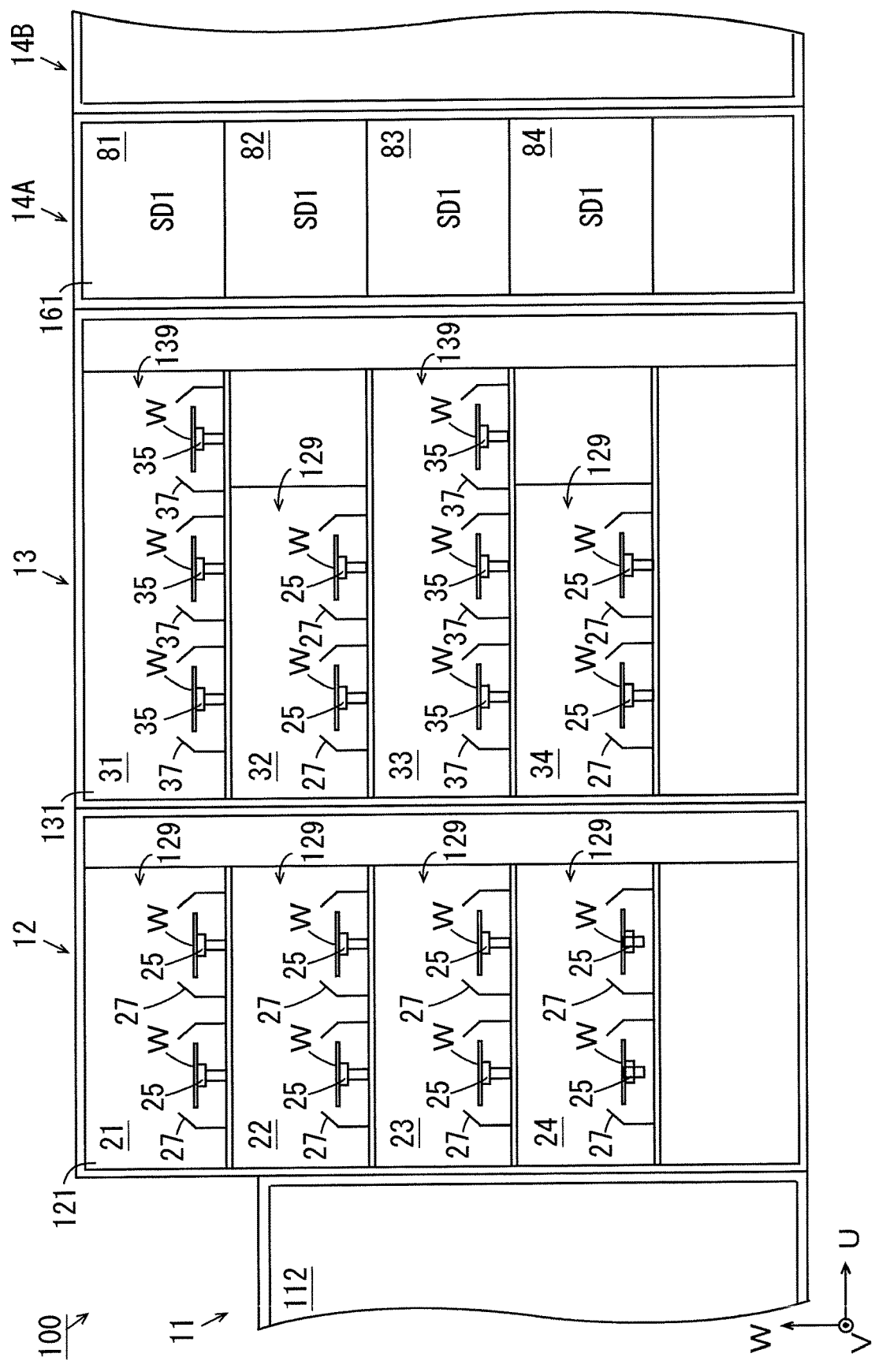

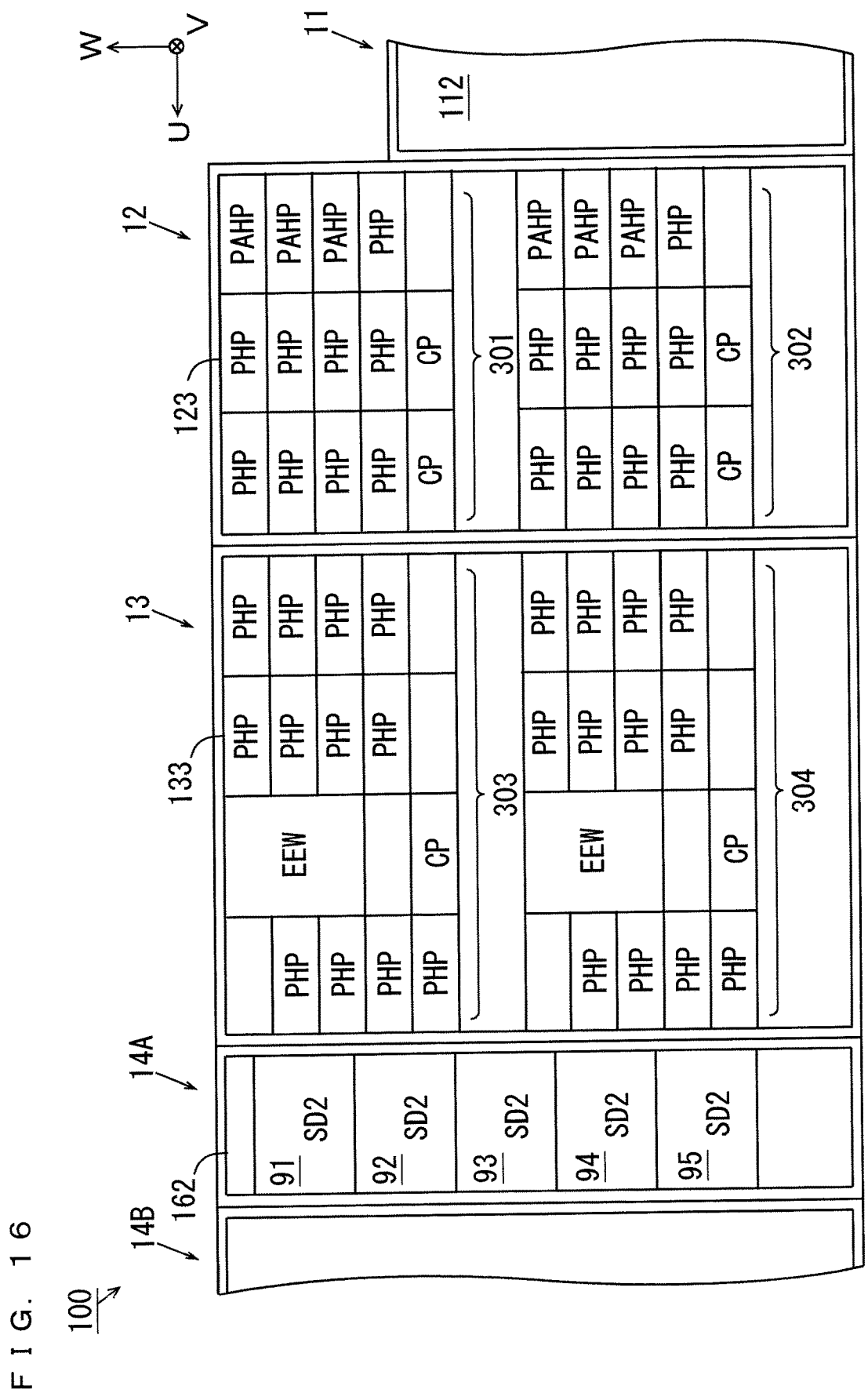

SUBSTRATE TRANSPORT DEVICE, SUBSTRATE PROCESSING APPARATUS INCLUDING THE SUBSTRATE TRANSPORT DEVICE, AND SUBSTRATE TRANSPORT METHOD

BACKGROUND OF THE INVENTION

Field of the Invention

The present invention relates to a substrate transport device that transports a substrate, a substrate processing apparatus including the substrate transport device, and a substrate transport method.

Description of Related Art

Substrate processing apparatuses are used to subject various substrates such as semiconductor substrates, substrates for liquid crystal display devices, plasma displays, optical disks, magnetic disks, magneto-optical disks, photomasks, and other substrates to various types of processing.

In such a substrate processing apparatus, in general, a single substrate is subjected to successive processes in a plurality of processing units. As such, the substrate processing apparatus is provided with a transport mechanism (substrate transport device) that transports the substrate among the plurality of processing units.

For example, a transport mechanism of a substrate processing apparatus as described in JP 2014-22589 A1 has a hand for holding a substrate. The transport mechanism is provided with a plurality of detectors. The plurality of detectors detect a plurality of portions at an outer periphery of the substrate held by the hand, respectively, whereby the position of the substrate on the hand is detected. Coordinate information indicating a position at which the substrate is received by the hand and a position at which the substrate is placed by the hand is stored for each processing unit. A reference position is set in the hand in advance. If the substrate is deviated from a predetermined position in one of the processing units, the hand of the transport mechanism receives the substrate in a state where the center of the substrate is deviated from the reference position. In this case, the deviation of the substrate from the reference position of the hand is detected based on the result of detection by the plurality of detectors before the substrate is placed in another processing unit. Based on the detected deviation, the coordinate information is corrected so as to cancel a deviation between the position of the center of the substrate to be placed by the hand in the other processing unit and a predetermined position in the other processing unit. The transport mechanism is controlled based on the corrected coordinate information. Thus, the substrate is placed at the predetermined position in the other processing unit.

BRIEF SUMMARY OF THE INVENTION

In order to achieve a further higher accuracy in processing the substrate, it is required to accurately transport the substrate to predetermined positions of the plurality of processing units. In this case, it is necessary to detect the deviation of the substrate from the reference position of the hand with a higher accuracy.

However, a cut-out for positioning is formed at the outer periphery of the substrate. Therefore, if the cut-out is detected by one of the plurality of detectors in the above-described substrate processing apparatus, detection accuracy of the position of the substrate on the hand is deteriorated due to a result of the detection of the cut-out. As such, the deviation of the substrate cannot be detected with high accuracy.

An object of the present invention is to provide a substrate transport device in which accuracy in transporting a substrate can be improved, and a substrate processing apparatus including the substrate transport device and a substrate transport method in which accuracy in transporting a substrate can be improved.

(1) A substrate transport device according to one aspect of the present invention that transports a substrate includes a movable element, a first driver that moves the movable element, a holder that is configured to hold the substrate, a second driver that moves the holder with respect to the movable element, first, second, third, fourth, and fifth detectors that are provided to detect first, second, third, fourth, and fifth portions different from one another in an outer periphery of the substrate held by the holder, and a transport controller that controls the first and second drivers during transport of the substrate, the transport controller includes a portion position calculator that calculates positions of the first, second, third, fourth, and fifth portions on the holder based on output signals of the first, second, third, fourth, and fifth detectors, respectively, an imaginary circle calculator that calculates four imaginary circles each passing through three of four positions of the first, second, third, and fourth portions calculated by the portion position calculator, a position determiner that determines a position of the substrate on the holder based on the four imaginary circles calculated by the imaginary circle calculator and the position of the fifth portion calculated by the portion position calculator, and a movement controller that controls the first and second drivers based on the position of the substrate determined by the position determiner.

In the substrate transport device, the positions of the first to fifth portions of the substrate on the holder are calculated based on the output signals of the first to fifth detectors, respectively. The four imaginary circles each passing through three of the four positions of the first to fourth portions are calculated.

When a cut-out for positioning the substrate is not present at the first to fourth portions detected respectively by the first to fourth detectors, all of the four imaginary circles represent the position of the substrate on the holder. Thus, the position of the substrate on the holder can accurately be determined based on the four imaginary circles. On the other hand, when the cut-out is present at any of the first to fourth portions, only one of the four imaginary circles represents the position of the substrate on the holder. When the cut-out is present at any of the first to fourth portions, the cut-out is not present at the fifth portion. Thus, an imaginary circle of the four imaginary circles, which represents the position of the substrate on the holder can be selected based on the four imaginary circles and the position of the fifth portion. Accordingly, the position of the substrate on the holder can accurately be determined based on the selected imaginary circle. Movement of the movable element and the holder is controlled based on the determined position of the substrate on the holder. This results in improved accuracy in transporting the substrate.

(2) The holder may have a predetermined reference position at which a center of the substrate is to be positioned when the substrates is held, a first imaginary line that is parallel to a moving direction of the holder with respect to the movable element and passes through the reference position, and a second imaginary line that is orthogonal to the first imaginary line, passes through the reference position, and is parallel to the substrate held by the holder may be defined, and first, second, third, and fourth regions divided by the first imaginary line and the second imaginary line may be defined, and the first, second, third, and fourth detectors may be arranged to be positioned in the first, second, third, and forth regions, respectively, during the detection of the outer periphery of the substrate held by the holder.

In this case, even if there is an error between actual positions and designed positions of the first to fourth detectors, deterioration of determination accuracy of the position of the substrate due to the error is reduced.

(3) The position determiner may calculate deviation amounts among center positions of the four imaginary circles, and when at least one of the calculated plurality of amounts of deviation exceeds a predetermined threshold value, the position determiner may select one of the four imaginary circles based on the four imaginary circles and the position of the fifth portion and may determine a position of the selected one imaginary circle as the position of the substrate on the holder.

In this case, since the cut-out is present at any of the first to fourth portions, the cut-out is not present at the fifth portion. As such, an imaginary circle representing the position of the substrate on the holder passes through the position of the fifth portion. Thus, the position of the substrate on the holder can be determined by selecting the imaginary circle of the four imaginary circles, which passes through the position of the fifth portion.

(4) The position determiner may determine the position of the substrate on the holder based on any or all of the four imaginary circles when all of the calculated plurality of amounts of deviation are not more than the threshold value.

In this case, the cut-out of the substrate is not present at any of the first to fourth portions. As such, the position of the substrate on the holder can be determined based on any or all of the four imaginary circles.

(5) The substrate transport device may further include a sixth detector that is provided to detect a sixth portion that is different from the first to fifth portions in the outer periphery of the substrate moved by the holder, the portion position calculator may further calculate a position of the sixth portion on the holder based on an output signal of the sixth detector when the holder moves with respect to the movable element, the transport controller may further include a distance calculator that calculates a distance between each of the center positions of the four imaginary circles and the position of the fifth portion as a first distance, and calculates a distance between each of the center positions of the four imaginary circles and the position of the sixth portion as a second distance, and the position determiner may calculate amounts of deviation among the center positions of the four imaginary circles, and when at least one of the calculated plurality of amounts of deviation exceeds a predetermined threshold value, the position determiner may select one of the four imaginary circles based on the respective positions of the first, second, third, and fourth portions and the plurality of first distances and the plurality of second distances calculated by the distance calculator and may determine a position of the selected one imaginary circle as the position of the substrate on the holder.

In this case, since the cut-out of the substrate is present at any of the first to fourth portions, the cut-out is not present at the fifth or sixth portion. As such, the imaginary circle representing the position of the substrate on the holder passes through the positions of the fifth and sixth portions. Thus, as for the imaginary circle of the four imaginary circles, which represents the position of the substrate on the holder, the first distance and the second distance are equal in length. As such, the imaginary circle representing the position of the substrate on the holder can easily be selected from the four imaginary circles based on the first distance and the second distance as for each imaginary circle. Thus, the position of the substrate on the holder can accurately be determined by simple processing.

(6) The position determiner may determine the position of the substrate on the holder based on any or all of the four imaginary circles when all of the calculated plurality of amounts of deviation are not more than the threshold value.

In this case, the cut-out of the substrate is not present at any of the first to fourth portions. As such, the position of the substrate on the holder can be determined based on any or all of the four imaginary circles.

(7) The transport controller may further include a storage that stores control information for controlling the movement controller such that the holder places the substrate at a predetermined position, and a control information corrector that corrects the control information such that a deviation between a position of the substrate to be placed by the holder and the predetermined position is cancelled based on the position determined by the position determiner before the holder places the substrate at the predetermined position during the transport of the substrate, and the movement controller may control the first and second drivers based on the corrected control information.

In this case, the substrate can accurately be placed at the predetermined position irrespective of the position of the substrate on the holder.

(8) A substrate processing apparatus that performs processing to a substrate according to another aspect of the present invention includes a processing unit having a supporter that supports the substrate and configured to perform processing to the substrate supported by the supporter, and the above-described substrate transport device, the movement controller of the substrate transport device controls the first and second drivers to transport the substrate to a predetermined position of the supporter in the processing unit.

With the substrate processing apparatus, the substrate can accurately be transported to the predetermined position in the processing unit irrespective of the position of the substrate on the holder. This improves accuracy in processing the substrate in the processing unit.

(9) A substrate transport method according to still another aspect of the present invention is a substrate transport method using a substrate transport device, the substrate transport device includes a movable element, a first driver that moves the movable element, a holder that is configured to hold the substrate, a second driver that moves the holder with respect to the movable element, and first, second, third, fourth, and fifth detectors that are provided to detect first, second, third, fourth, and fifth portions different from one another in an outer periphery of the substrate held by the holder, and the substrate transport method includes the steps of: calculating positions of the first, second, third, fourth, and fifth portions on the holder based on output signals of the first, second, third, fourth, and fifth detectors, respectively, calculating four imaginary circles each passing through three of four positions of the calculated first, second, third, and fourth portions, determining a position of the substrate on the holder based on the calculated four imaginary circles and the calculated position of the fifth portion, and controlling the first and second drivers based on the determined position of the substrate.

In the substrate transport method, the positions of the first to fifth portions of the substrate on the holder are calculated based on the output signals of the first to fifth detectors, respectively. When the cut-out for positioning the substrate is not present at the first to fourth portions, the position of the substrate on the holder can accurately be determined based on the four imaginary circles. On the other hand, when the cut-out is present at any of the first to fourth portions, the position of the substrate on the holder can accurately be determined based on the four imaginary circles and the position of the fifth portion. Movement of the movable element and the holder is controlled based on the determined position of the substrate on the holder. This results in improved accuracy in transporting the substrate.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 6 is a block diagram showing a functional configuration of a transport controller;

FIG. 14 is a side view mainly showing a transporter of FIG. 13;

FIG. 15 is a schematic side view of the substrate processing apparatus mainly showing a coating processing section, a coating development processing section and a cleaning drying processing section of FIG. 13; and FIG. 16 is a schematic side view of the substrate processing apparatus mainly showing thermal processing sections and the cleaning drying processing section of FIG. 13.

DESCRIPTION OF THE PREFERRED EMBODIMENTS

A substrate transport device according to embodiments of the present invention, a substrate processing apparatus including the substrate transport device, and a substrate transport method will now be described with reference to the drawings. In the following description, a substrate refers to a semiconductor substrate, a substrate for an FPD (Flat Panel Display) such as a liquid crystal display or an organic EL (Electro Luminescence) display, a substrate for an optical disk, a substrate for a magnetic disk, a substrate for a magneto-optical disk, a substrate for a photomask, a substrate for a solar battery, or the like.

(1) Configuration of Substrate Transport Device According to First Embodiment

Figure 1A:
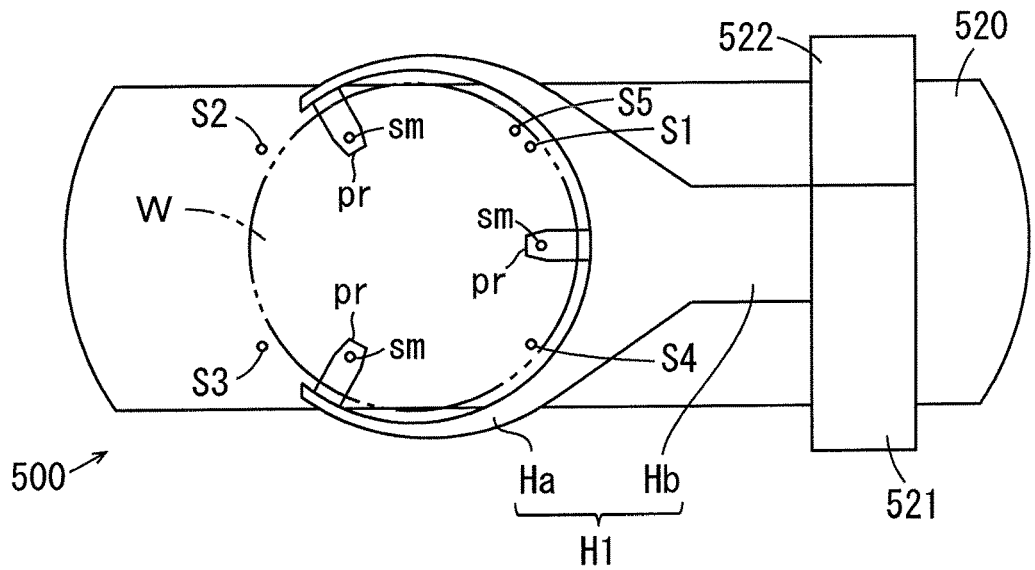
FIG. 1A is a plan view of a substrate transport device according to a first embodiment.
Figure 1B:
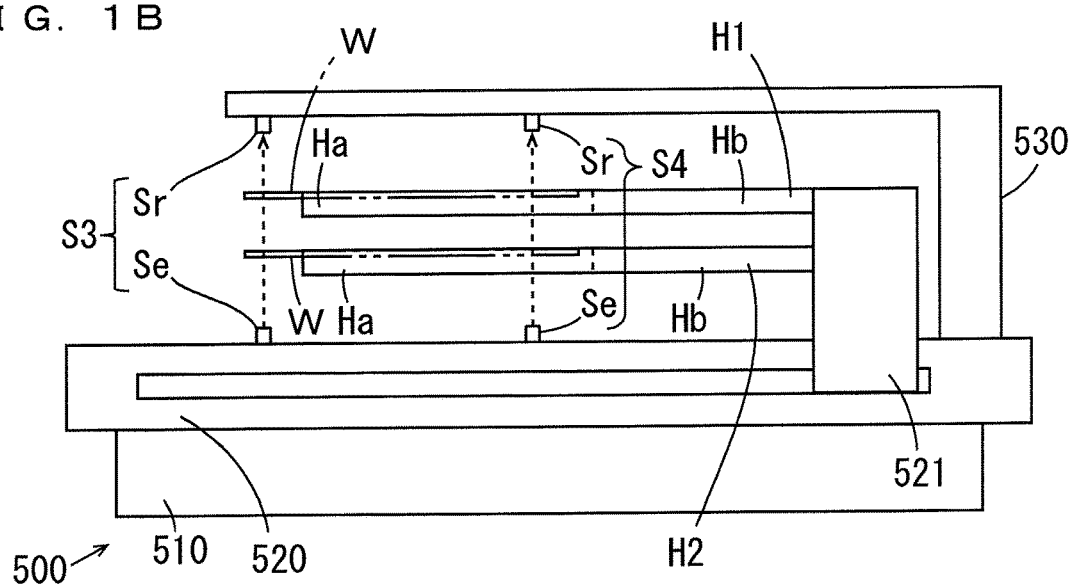
FIG. 1B is a side view of the substrate transport device according to the first embodiment.
Figure 1C:
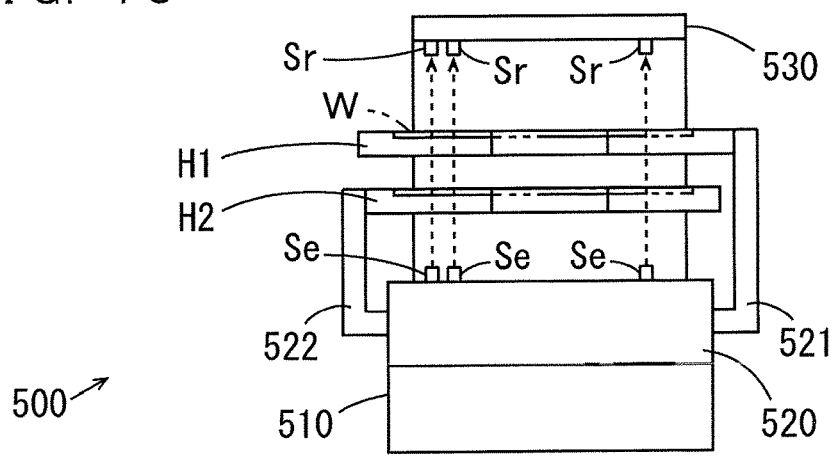
FIG. 1C is a front view of the substrate transport device according to the first embodiment.

FIGS. 1A, 1B, and 1C are, respectively, a plan view, a side view, and a front view of a substrate transport device 500 according to a first embodiment. The substrate transport device 500 of FIG. 1 includes a movement member 510 (FIGS. 1B, 1C), a rotation member 520, two hands H1, H2, and a plurality of detectors S1 to S5 (FIG. 1A). In this embodiment, five detectors S1 to S5 are provided. The movement member 510 is configured to be movable in a horizontal direction along a guide rail (not shown).

The rotation member 520 of a substantially rectangular parallelepiped shape is rotatably provided around a vertical axis on the movement member 510. The hands H1, H2 are supported on the rotation member 520 by support members 521, 522, respectively. The hands H1, H2 are configured to be capable of advancing and retreating in a longitudinal direction of the rotation member 520. In this embodiment, the hand H2 is positioned above an upper surface of the rotation member 520, and the hand H1 is positioned above the hand H2.

Each of the hands H1 and H2 is constituted by a guide Ha and an arm Hb. The guide Ha has a substantially circular arc shape, and the arm Hb has a rectangular shape. A plurality of (three in this example) projections pr are formed to face an inside of the guide Ha at an inner periphery of the guide Ha. A tip end of each projection pr is provided with a suction portion sm. Each suction portion sm is connected to an intake system (not shown). A substrate W is placed on the plurality of suction portions sm of the plurality of projections pr. In this state, a plurality of portions of the substrate W placed on the plurality of suction portions sm are sucked to the plurality of suction portions sm, respectively, by the intake system.

Each of the plurality of detectors S1 to S5 is a transmission type photoelectric sensor constituted by a light emitter Se and a light receiver Sr. The plurality of light emitters Se are arranged to be spaced apart from one another along a circle that corresponds to an outer periphery of the substrate W, and are attached to the upper surface of the rotation member 520. The plurality of light receivers Sr are arranged on the support member 530 (FIGS. 1B, 1C) to be opposite to the plurality of light emitters Se, respectively, above the rotation member 520. The support member 530 is not shown in FIG. 1A. In this embodiment, the two detectors S2, S3 are provided further forward than the three detectors S1, S4, S5 in an advancing/retreating direction of the hand H1. Details of the arrangement of the five detectors S1 to S5 will be described below. The plurality of light emitters Se each emit light upward. The plurality of light receivers Sr receive the lights emitted from their corresponding opposite light emitters Se as returning lights.

When the substrate W is present between the light emitters Se and the light receivers Sr of the respective detectors S1 to S5, the lights emitted from the light emitters Se are not incident on the light receivers Sr. A state where the light is not incident on each light receiver Sr is referred to as a light shielding state. When the substrate W is not present between the light emitters Se and the light receivers Sr of the respective detectors S1 to S5, the lights emitted from the light emitters Se are incident on the light receivers Sr. A state where the light is incident on each light receiver Sr is referred to as a light incidence state. Each light receiver Sr outputs a detection signal indicating the light incidence state and the light shielding state.

A limit position on the rotation member 520 at which the hands H1, H2 can retreat in the advancing/retreating direction of the hands H1, H2 is referred to as an initial advance/retreat position (home position). Positions of a plurality of portions in the outer periphery of the substrate W held by the hand H1 can be detected based on a time point at which the detection signal of each detector S2, S3 switches from the light incidence state to the light shielding state and a time point at which the detection signal of each detector S1, S4, S5 switches from the light shielding state to the light incidence state when the hand H1 holding the substrate W advances from the initial advance/retreat position on the rotation member 520. Similarly, positions of the plurality of portions in the outer periphery of the substrate W held by the hand H1 can be detected based on a time point at which the detection signal of each detector S2, S3 switches from the light shielding state to the light incidence state and a time point at which the detection signal of each detector S1, S4, S5 switches from the light incidence state to the light shielding state when the hand H1 holding the substrate W retreats to the initial advance/retreat position on the rotation member 520. In a similar manner, positions of a plurality of portions in an outer periphery of a substrate W held by the hand H2 can be detected. In the following description, the plurality of portions in the outer periphery of the substrate W, which are detected based on the detection signals of the detectors S1, S2, S3, S4, S5, respectively, are referred to as portions p1, p2, p3, p4, p5, respectively.

On each hand H1, H2, a position of reference at which a center of the held substrate W is to be positioned (hereinafter referred to as the reference position) is determined in advance. The reference position on each hand H1, H2 is, for example, a center position of a circle formed along an inner periphery of the guide Ha. The reference position on each hand H1, H2 may be a center position of the plurality of suction portions sm.

(2) Arrangement of Plurality of Detectors S1 to S5

Figure 2:
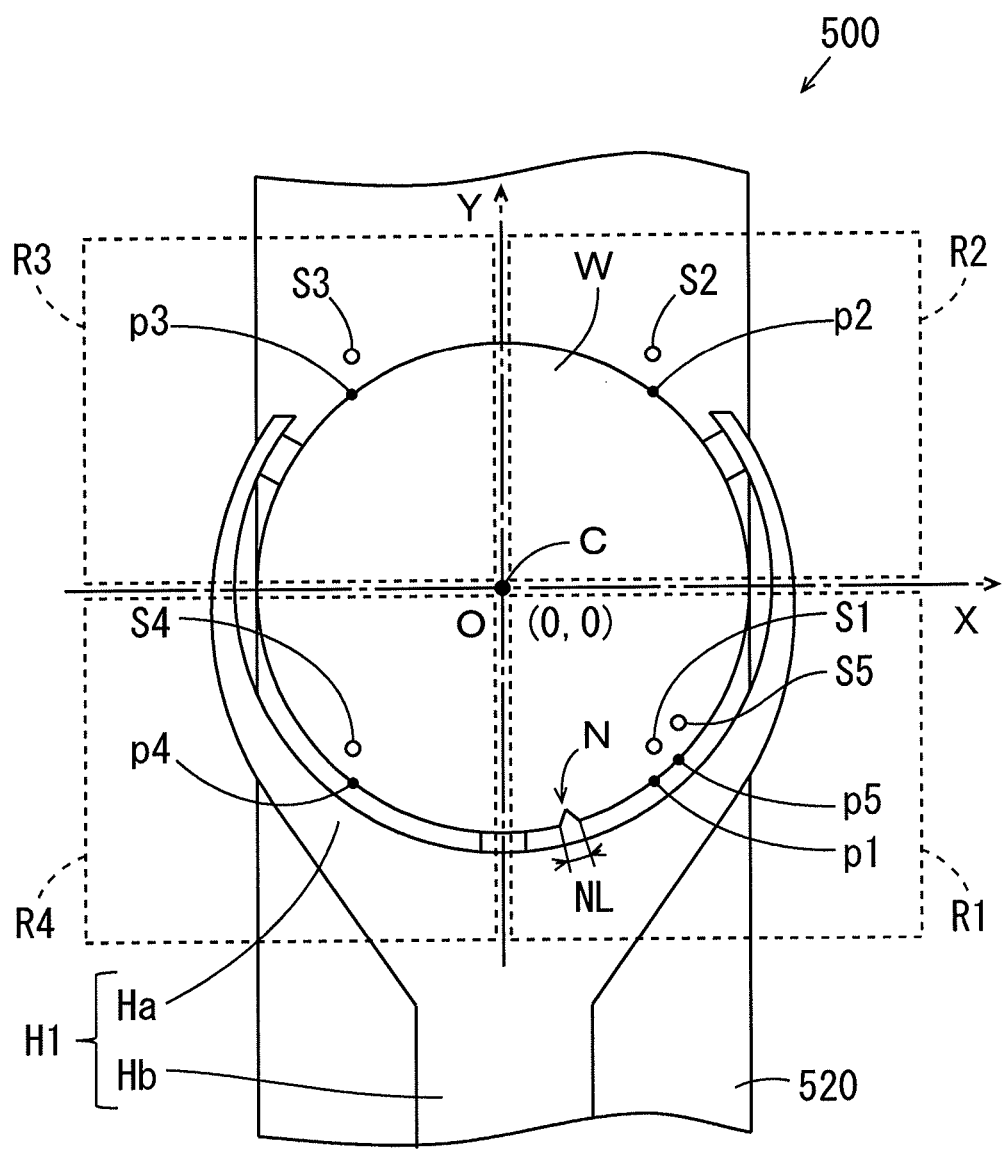
FIG. 2 is a partially enlarged plan view of the substrate transport device showing one example of arrangement of a plurality of detectors.

FIG. 2 is a partially enlarged plan view of the substrate transport device 500 showing one example of arrangement of the plurality of detectors S1 to S5. FIG. 2 shows the hand H1 located at the initial advance/retreat position as well as a substrate W held by the hand H1. As denoted by the dot and dashed arrow in FIG. 2, an X-Y coordinate system having an X axis and a Y axis is defined at each hand H1, H2 of FIG. 1. The X axis and the Y axis are positioned in a horizontal plane parallel to the substrate W held by each hand H1, H2 and are orthogonal to each other at the reference position of each hand H1, H2. As such, the reference position is an origin O of the X-Y coordinate system. In this example, the Y axis is defined to be parallel to the advancing/retreating direction of each hand H1, H2.

As shown in FIG. 2, the detectors S1, S2, S3, S4 are fixed on the rotation member 520 so as to be positioned in four regions R1, R2, R3, R4 respectively that are divided by the X axis and the Y axis when detecting the portions p1, p2, p3, p4 of the substrate W held by each hand H1, H2. The remaining detector S5 is fixed on the rotation member 520 so as to be positioned in the region R1 when detecting the portion p5 of the substrate W held by each hand H1, H2.

A cut-out for positioning such as a notch N or an orientation flat is formed in the outer periphery of the substrate W. The substrate W according to this embodiment has a notch N as an example of the cutout. Each detector S1 to S5 is arranged to be spaced apart from another detector by a distance larger than a length NL of the notch N in a circumferential direction of the substrate W in a plan view.

(3) Configuration of Control System of Substrate Transport Device 500

Figure 3:
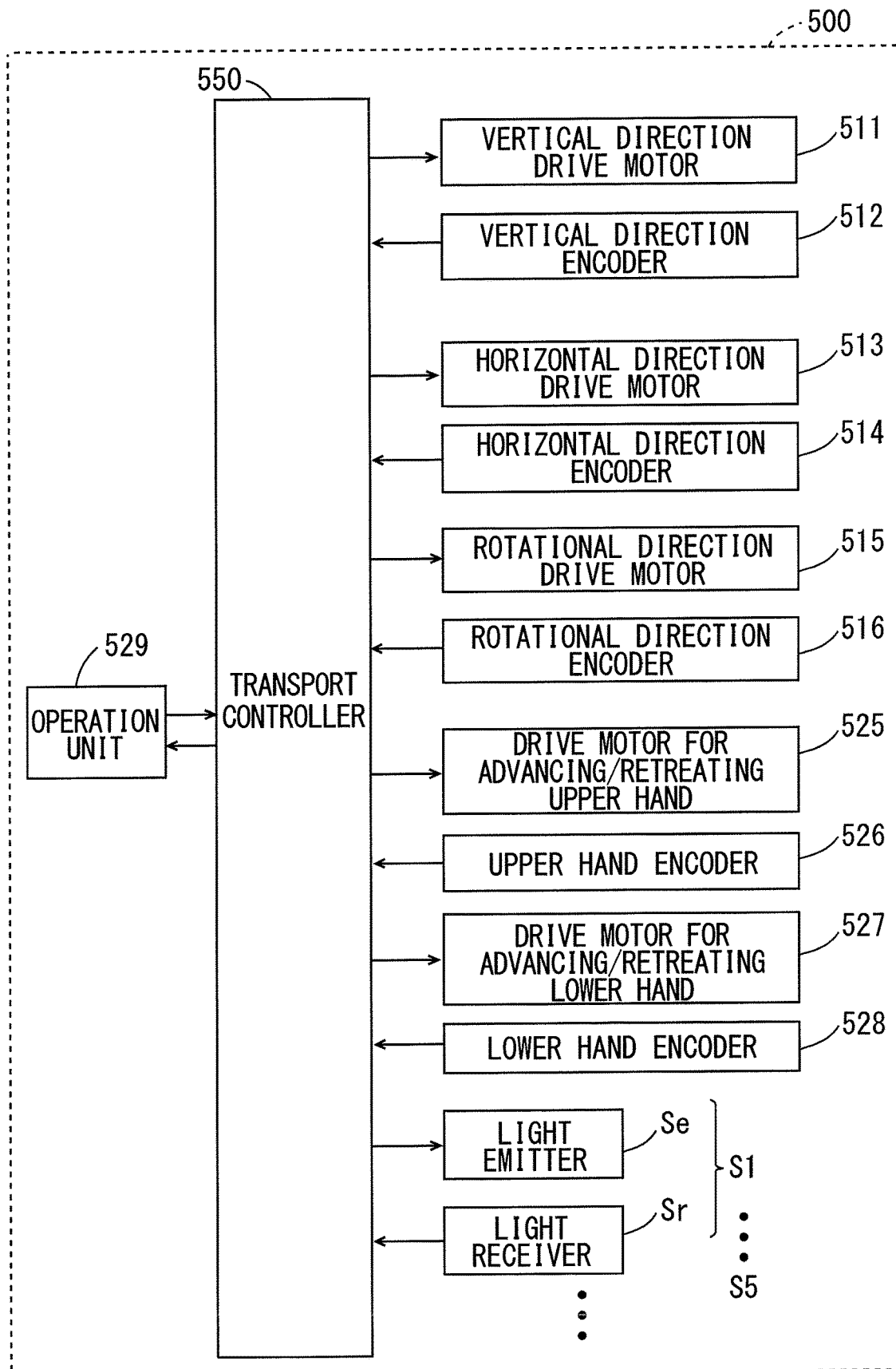
FIG. 3 is a block diagram showing the configuration of a control system of the substrate transport device.

FIG. 3 is a block diagram showing the configuration of a control system of the substrate transport device 500. As shown in FIG. 3, the substrate transport device 500 includes a vertical direction drive motor 511, a vertical direction encoder 512, a horizontal direction drive motor 513, a horizontal direction encoder 514, a rotational direction drive motor 515, a rotational direction encoder 516, a drive motor for advancing/retreating an upper hand 525, an upper hand encoder 526, a drive motor for advancing/retreating a lower hand 527, a lower hand encoder 528, a plurality of detectors S1 to S5, a transport controller 550, and an operation unit 529.

The vertical direction drive motor 511 moves the movement member 510 of FIG. 1 in a vertical direction under the control of the transport controller 550. The vertical direction encoder 512 outputs a signal indicating a rotation angle of the vertical direction drive motor 511 to the transport controller 550. Thus, the transport controller 550 can detect a position of the movement member 510 in the vertical direction.

The horizontal direction drive motor 513 moves the movement member 510 of FIG. 1 in a horizontal direction under the control of the transport controller 550. The horizontal direction encoder 514 outputs a signal indicating a rotation angle of the horizontal direction drive motor 513 to the transport controller 550. Thus, the transport controller 550 can detect a position of the movement member 510 in the horizontal direction.

The rotational direction drive motor 515 rotates the rotation member 520 of FIG. 1 around a vertical axis under the control of the transport controller 550. The rotational direction encoder 516 outputs a signal indicating a rotation angle of the rotational direction drive motor 515 to the transport controller 550. Thus, the transport controller 550 can detect an orientation of the rotation member 520 in a horizontal plane.

The drive motor for advancing/retreating the upper hand 525 advances or retreats the upper hand H1 of FIG. 1 in the horizontal direction on the rotation member 520 under the control of the transport controller 550. The upper hand encoder 526 outputs a signal indicating a rotation angle of the drive motor for advancing/retreating the upper hand 525 to the transport controller 550. Thus, the transport controller 550 can detect a position of the hand H1 on the rotation member 520.

The drive motor for advancing/retreating the lower hand 527 advances/retreats the hand H2 of FIG. 1 in the horizontal direction on the rotation member 520 under the control of the transport controller 550. The lower hand encoder 528 outputs a signal indicating a rotation angle of the drive motor for advancing/retreating the lower hand 527 to the transport controller 550. Thus, the transport controller 550 can detect a position of the hand H2 on the rotation member 520.

FIG. 3 shows only the detector S1 of the detectors S1 to S5. The light emitters Se of the detectors S1 to S5 emit light toward the light receivers Sr under the control of the transport controller 550. The detection signals of the light receivers Sr are applied to the transport controller 550. Thus, the transport controller 550 can determine whether each of the detectors S1 to S5 is in a light incidence state or a light shielding state. The transport controller 550 can calculate positions of the portions p1 to p5 of a substrate W on the hand H1 based on the detection signals of the plurality of detectors S1 to S5 and the output signal of the upper hand encoder 526. Similarly, the transport controller 550 can calculate positions of the portions p1 to p5 of a substrate W on the hand H2 based on the detection signals of the plurality of detectors S1 to S5 and the output signal of the lower hand encoder 528.

The operation unit 529 is connected to the transport controller 550. A user can apply various instructions and information to the transport controller 550 by operating the operation unit 529.

(4) Determination of Position of Substrate W on Hand H1, H2

In the substrate transport device 500 according to this embodiment, the portions p1 to p5 of the substrate W on the hand H1 are detected by the detectors S1 to S5, and a position of the substrate W on the hand H1 is determined based on the positions of the detected portions p1 to p5. Similarly, the portions p1 to p5 of the substrate W on the hand H2 are detected by the detectors S1 to S5, and a position of the substrate W on the hand H2 is determined based on the positions of the detected portions p1 to p5. Based on the determined positions of the substrates W, the above-described vertical direction drive motor 511, horizontal direction drive motor 513, rotational direction drive motor 515, drive motor for advancing/retreating the upper hand 525, and drive motor for advancing/retreating the lower hand 527 are controlled. A method of determining the position of the substrate W on the hand H1 will now be described.

First of all, the hand H1 holding the substrate W retreats to the initial advance/retreat position or advances from the initial advance/retreat position. Accordingly, the portions p1 to p5 of the substrate W are detected by the detectors S1 to S5, respectively. The positions of the portions p1 to p5 of the substrate W on the hand H1 are calculated based on the detection signals of the detectors S1 to S5 and the output signal of the upper hand encoder 526 of FIG. 3. Also, in the X-Y coordinate system, four imaginary circles each passing through three of the four portions p1, p2, p3, p4 are calculated, and center positions of the four imaginary circles are each calculated. Further, a plurality of amounts of deviation among the four center positions are calculated.

Figure 4:
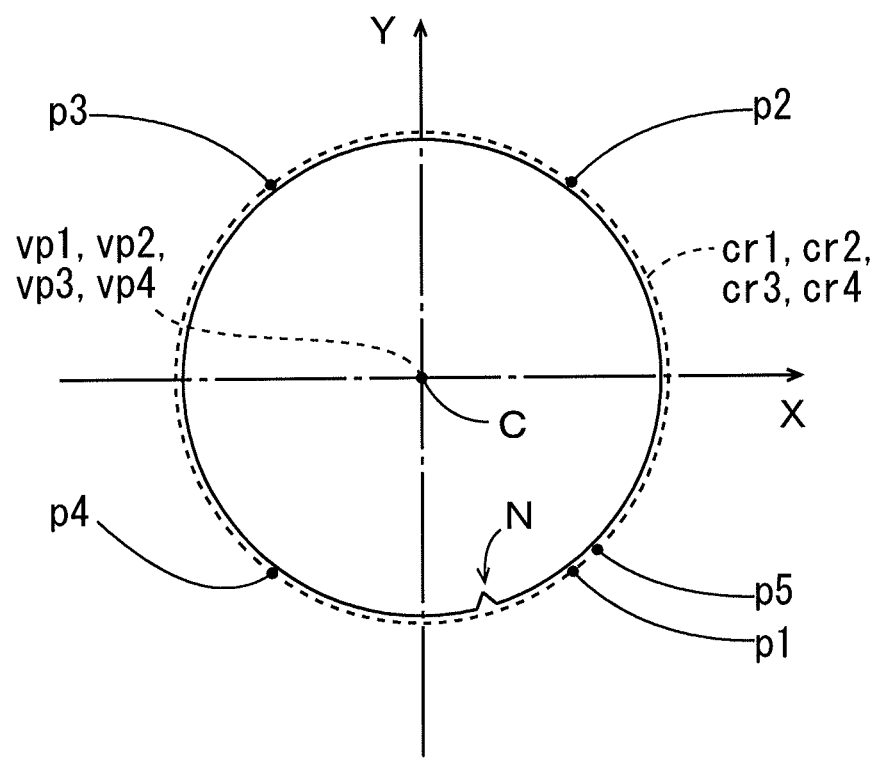
FIG. 4 is a plan view showing a positional relationship between a substrate on a hand and four imaginary circles when all of a plurality of amounts of deviation are zero.

FIG. 4 is a plan view showing positional relationships between the substrate W on the hand H1 and the four imaginary circles when all of the plurality of amounts of deviation are 0 (zero). The hand H1 of FIG. 2 is not shown in FIG. 4. In the following explanation, the imaginary circle passing through the portions p1, p2, p3 is referred to as the imaginary circle cr1, the imaginary circle passing through the portions p2, p3, p4 is referred to as the imaginary circle cr2, the imaginary circle passing through the portions p1, p3, p4 is referred to as the imaginary circle cr3, and the imaginary circle passing through the portions p1, p2, p4 is referred to as the imaginary circle cr4. Center positions of the imaginary circles cr1, cr2, cr3, cr4 on the hand H1 are represented as vp1, vp2, vp3, vp4, respectively.

As shown in FIG. 4, if all of the plurality of amounts of deviation among the center positions vp1 to vp4 are 0, the four center positions vp1 to vp4 coincide with a center position C of the substrate W on the hand H1. Even if at least one of the plurality of amounts of deviation is not 0, when all of the plurality of amounts of deviation among the four center positions vp1 to vp4 are not more than a predetermined threshold value, the four center positions vp1 to vp4 almost coincide with the center position C of the substrate W on the hand H1. Here, the threshold value is defined, for example, as an acceptable error between actual positions of the detectors S1 to S5 and attachment positions in design (designed positions) of the detectors S1 to S5.

In this way, when all of the plurality of amounts of deviation are not more than the threshold value, a notch N is not present at any portions p1 to p4 of the substrate W detected by the detectors S1 to S4. As such, since all of the four imaginary circles cr1 to cr4 represent the position of the substrate W on the hand H1, it is possible to determine the position of the substrate W on the hand H1 based on any or all of the four imaginary circles cr1 to cr4.

FIGS. 5A to 5D are plan views showing positional relationships between the substrate W on the hand H1 and the four imaginary circles cr1 to cr4 when at least one of the plurality of amounts of deviation exceeds the threshold value. The hand H1 of FIG. 2 is not shown in FIGS. 5A to 5D. In FIGS. 5A to 5D, the positional relationships between the substrate W and the imaginary circles cr1, cr2, cr3, cr4 are individually shown in FIGS. 5A, 5B, 5C, and 5D.

Figure 5A:
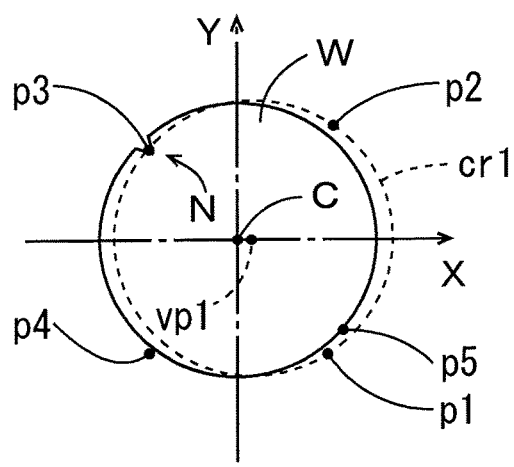
FIGS. 5A to 5D are plan views showing positional relationships between the substrate on the hand and the four imaginary circles when at least one of the plurality of amounts of deviation exceeds a threshold value.
Figure 5B:
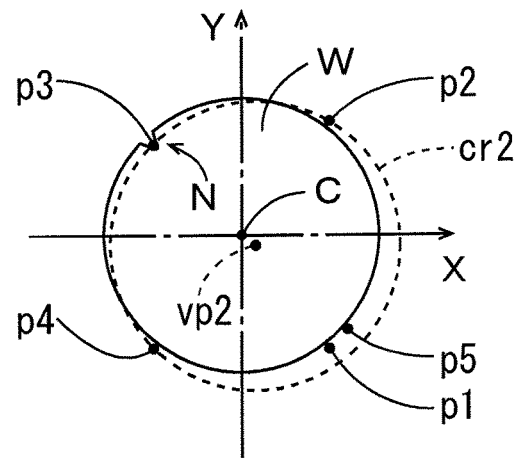
Figure 5C:
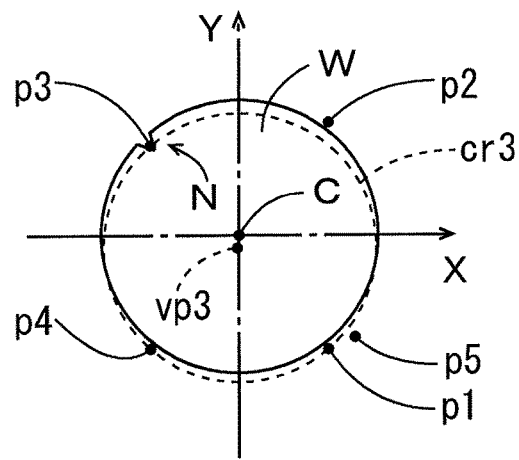
Figure 5D:
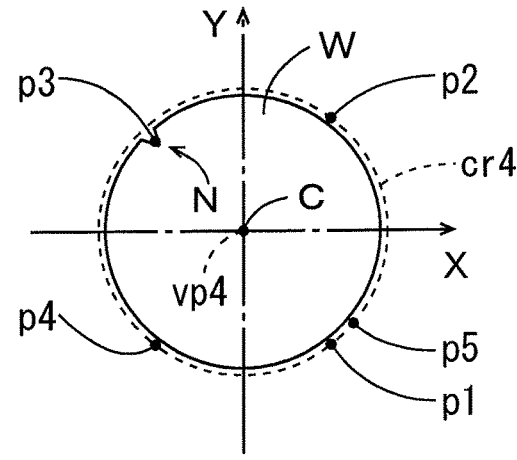

When at least one of the plurality of amounts of deviation exceeds the threshold value, only one center position of the four center positions vp1 to vp4 (the center position vp4 of the imaginary circle cr4 in this example) coincides with or almost coincides with the center position C of the substrate W on the hand H1 (FIG. 5D). On the other hand, the remaining three center positions (the center positions vp1, vp2, vp3 of the imaginary circles cr1, cr2, cr3 in this example) are deviated to a greater extent than a fixed value from the center position C of the substrate W on the hand H1 (FIGS. 5A, 5B, 5C). In this way, when at least one of the plurality of amounts of deviation exceeds the threshold value, the notch N is present at any of the portions p1 to p4 of the substrate W (the portion p3 in this example) detected by the detectors S1 to S4. In this case, since the notch N is not present at the portion p5 of the substrate W detected by the detector S5, the imaginary circle representing the position of the substrate W on the hand H1 passes through the position of the portion p5. Thus, the imaginary circle passing through the position of the portion p5 among the four imaginary circles cr1 to cr4 (the imaginary circle cr4 in this example) is selected, whereby the position of the substrate W on the hand H1 can be determined based on the selected imaginary circle.

(5) Functional Configuration of Transport Controller 550

FIG. 6 is a block diagram showing a functional configuration of the transport controller 550. The transport controller 550 includes a portion position calculator 51, an imaginary circle calculator 52, a substrate position determiner 53, a detector position storage 54, a threshold value storage 55, a movement controller 58, a coordinate information storage 59, and a coordinate information corrector 60. The transport controller 550 is constituted by a CPU (Central Processing Unit), a RAM (Random Access Memory), a ROM (Read Only Memory), and a storage device. The CPU executes a computer program stored in a storage medium such as the ROM or the storage device, whereby the function of each of constituent elements of the transport controller 550 is implemented. Part or all of the constituent elements of the transport controller 550 may be implemented by a hardware such as an electronic circuit.

It is assumed here that the substrate transport device 500 receives a substrate W placed at a predetermined position (hereinafter referred to as a receiving position) in one processing unit, transports the received substrate W, and places the substrate W at a predetermined position (hereinafter referred to as a placing position) in another processing unit. The receiving position and the placing position are represented by coordinates of a fixed UVW coordinate system. The coordinate of the receiving position is referred to as the receiving coordinate, and the coordinate of the placing position is referred to as the placement coordinate.

The coordinate information storage 59 stores in advance the receiving coordinate of the receiving position and the placement coordinate of the placing position as coordinate information. Based on the coordinate information (receiving coordinate) stored in the coordinate information storage 59, the movement controller 58 controls the vertical direction drive motor 511, the horizontal direction drive motor 513, and the rotational direction drive motor 515 of FIG. 3 to receive the substrate W from the receiving position, and also controls the drive motor for advancing/retreating the upper hand 525 or the drive motor for advancing/retreating the lower hand 527 of FIG. 3. At this time, the hand H1 or the hand H2 advances from the initial advance/retreat position to receive the substrate W at the receiving position, and then retreats to the initial advance/retreat position.

The detector position storage 54 stores the designed positions of the plurality of detectors S1 to S5 as detector information. The portion position calculator 51 calculates the positions of the plurality of portions p1 to p5 of the substrate W on the hand H1 or H2 based on the detection signals of the plurality of detectors S1 to S5, the output signal of the upper hand encoder 526 or the lower hand encoder 528, and the detector information stored in the detector position storage 54.

The imaginary circle calculator 52 calculates the four imaginary circles cr1 to cr4 (FIGS. 4 and 5) based on the portions p1 to p4 calculated by the portion position calculator 51, respectively. The imaginary circle calculator 52 also calculates the center positions vp1 to vp4 (FIGS. 4 and 5) of the calculated respective imaginary circles cr1 to cr4.

The threshold value storage 55 stores the above-described threshold value. The substrate position determiner 53 calculates the plurality of amounts of deviation among the plurality of center positions vp1 to vp4 calculated by the imaginary circle calculator 52. The substrate position determiner 53 also determines whether all of the plurality of amounts of deviation are not more than the threshold value stored in the threshold value storage 55.

When all of the plurality of amounts of deviation are not more than the threshold value, the substrate position determiner 53 determines the position of the substrate W on the hand H1 or H2 based on any or all of the four imaginary circles cr1 to cr4. At this time, the substrate position determiner 53 may select one imaginary circle for use in determination, based on a distance between each of the center positions vp1 to vp4 and the reference position. For example, the substrate position determiner 53 may select an imaginary circle that has an n-th (n is an integer of 1 to 4) smallest distance between each of the center positions vp1 to vp4 and the reference position. Alternatively, the substrate position determiner 53 may determine an average position of all of the imaginary circles cr1 to cr4 as the position of the substrate W on the hand H1 or H2.

On the other hand, when at least one of the plurality of amounts of deviation exceeds the threshold value, the substrate position determiner 53 selects an imaginary circle of the four imaginary circles cr1 to cr4, which passes through the position of the portion p5 calculated by the portion position calculator 51, and determines the position of the substrate W on the hand H1 or H2 based on the selected imaginary circle.

The coordinate information corrector 60 calculates a deviation of the center position C of the substrate W from the reference position of the hand H1 or H2 based on the position of the substrate W on the hand H1 or H2 determined by the substrate position determiner 53. The coordinate information corrector 60 also corrects the coordinate information (placement coordinate) stored in the coordinate information storage 59 based on the calculated deviation. Based on the corrected coordinate information (placement coordinate) stored in the coordinate information storage 59, the movement controller 58 controls the vertical direction drive motor 511, the horizontal direction drive motor 513, and the rotational direction drive motor 515 of FIG. 3 to place the substrate W received at the receiving position to the placing position, and also controls the drive motor for advancing/retreating the upper hand 525 or the drive motor for advancing/retreating the lower hand 527 to place the substrate W received at the receiving position to the placing position. At this time, the hand H1 or H2 advances from the initial advance/retreat position.

(6) Operation of Substrate Transport Device 500

Figure 7:
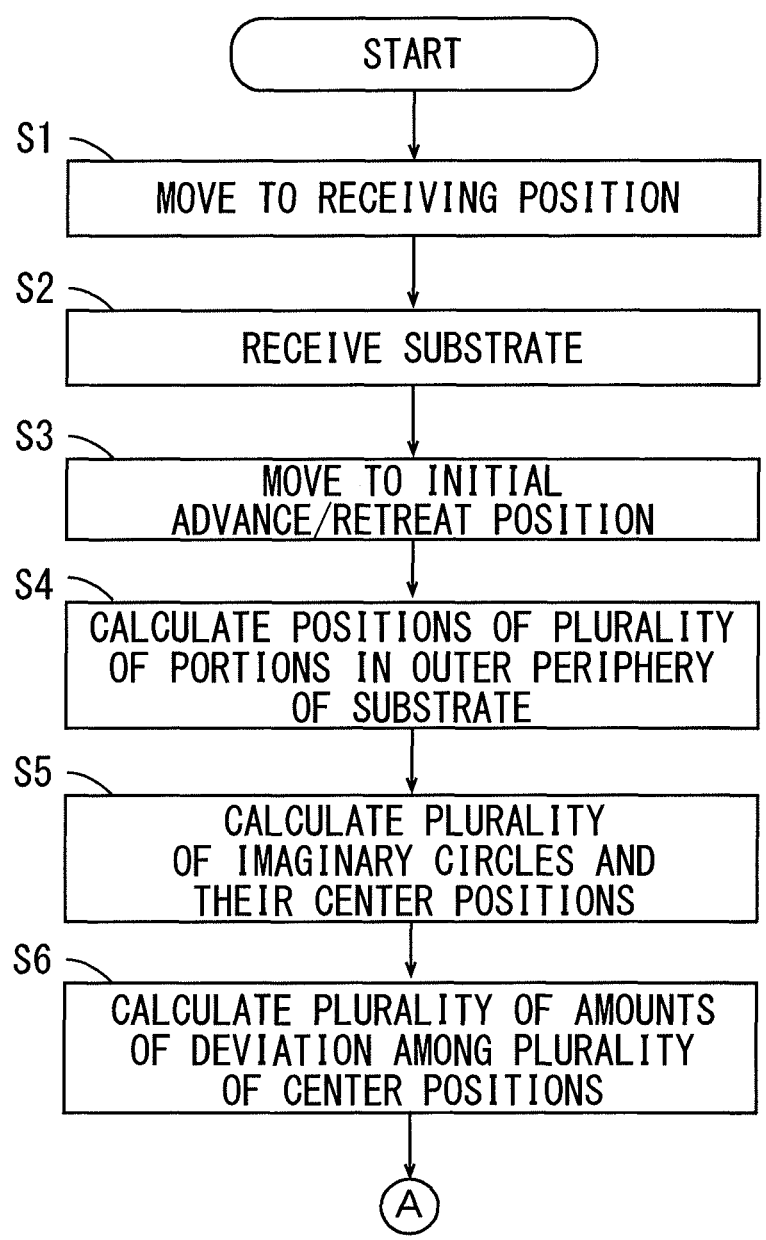
FIG. 7 is a flowchart showing a basic transport operation of the substrate by the substrate transport device.
Figure 8:
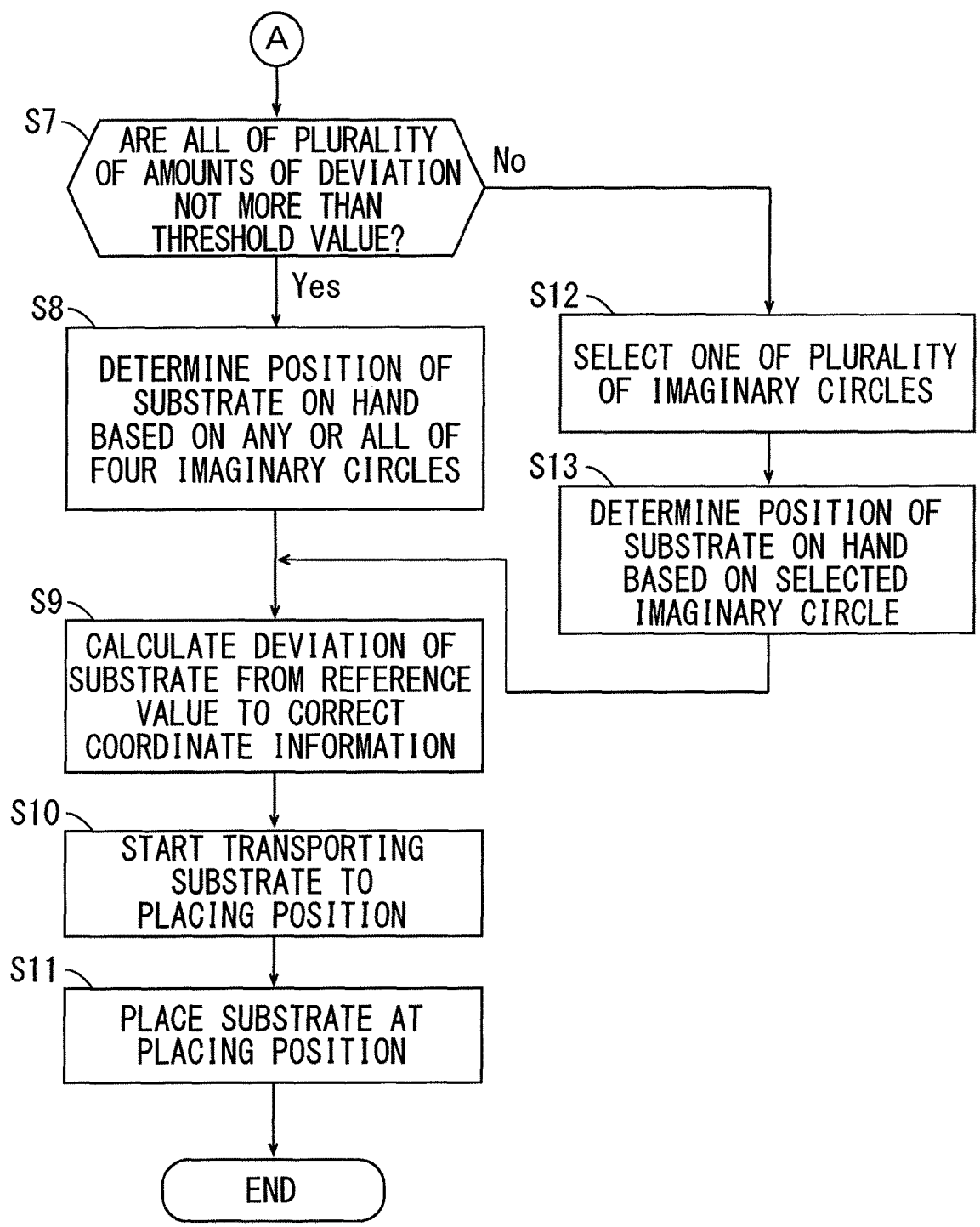
FIG. 8 is a flowchart showing the basic transport operation of the substrate by the substrate transport device.

FIGS. 7 and 8 are flowcharts showing a basic transport operation of a substrate W by the substrate transport device 500. A transport operation of the substrate W using the hand H1 will be described below. In an initial state, the hand H1 is positioned at the initial advance/retreat position on the rotation member 520. It is assumed that the hand H1 in the initial state does not hold the substrate W.

Based on the coordinate information (receiving coordinate) stored in the coordinate information storage 59, the movement controller 58 of FIG. 6 makes the substrate transport device 500 move to the vicinity of the receiving position (step S1), and makes the hand H1 advance to receive the substrate W at the receiving position (step S2). The movement controller 58 also makes the hand H1, which has received the substrate W, retreat to the initial advance/retreat position (step S3). At this time, the portion position calculator 51 calculates positions of the plurality of portions p1 to p5 in the outer periphery of the substrate W on the hand H1 based on the detection signals of the plurality of detectors S1 to S5 and the output signal of the upper hand encoder 526 (step S4).

The imaginary circle calculator 52 calculates four imaginary circles cr1 to cr4 each passing through three of the four calculated positions of the portions p1 to p4 of the substrate W, and also calculates center positions vp1 to vp4 of the calculated imaginary circles cr1 to cr4, respectively (step S5).

Then, the substrate position determiner 53 calculates a plurality of amounts of deviation among the plurality of calculated center positions vp1 to vp4 (step S6), and determines whether all of the plurality of calculated amounts of deviation are not more than the threshold value stored in the threshold value storage 55 (step S7).

When all of the plurality of calculated amounts of deviation are not more than the threshold value, the substrate position determiner 53 determines a position of the substrate W on the hand H1 based on any or all of the four imaginary circles cr1 to cr4 (step S8).

Then, the coordinate information corrector 60 calculates a deviation of the center position C of the substrate W from the reference position based on the determined position of the substrate W, and corrects the coordinate information (placement coordinate) stored in the coordinate information storage 59 so as to cancel a deviation between a position of the substrate W to be placed by the hand H1 and the placing position based on the calculated result (step S9).

After that, the movement controller 58 makes the substrate transport device 500 start transporting the substrate W to the placing position based on the corrected coordinate information (placement coordinate) (step S10) and place the substrate W held by the hand H1 at the placing position (step S11). This makes it possible to accurately place the substrate W at the placing position irrespective of the position of the substrate W on the hand H1.

In the above-described step S7, when at least one of the plurality of amounts of deviation exceeds the threshold value, the substrate position determiner 53 selects one of the four imaginary circles cr1 to cr4, which passes through the position of the portion p5 (step S12). The substrate position determiner 53 subsequently determines the position of the substrate W on the hand H1 based on the selected imaginary circle (step S13) and proceeds to step S9.

In the above-described transport operation, the operation in step S10 may be performed after the operation in step S3 and before the operation in step S4. In this case, the portion position calculator 51 may calculate the positions of the plurality of portions p1 to p5 in the outer periphery of the substrate W on the hand H1 when the hand H1 or H2 holding the received substrate W advances from the initial advance/retreat position. After that, the operations in steps S5 to S9 or the operations in steps S5 to S7, S12, S13, and S9 as described above may be performed in parallel with the operation of transporting the substrate W to the placing position.

(7) Effects of First Embodiment

In the substrate transport device 500 according to this embodiment, the positions of the portions p1 to p5 of the substrate W on each of the hands H1, H2 are calculated based on the detection signals of the five detectors S1 to S5. The four imaginary circles cr1 to cr4 are calculated based on the positions p1 to p4, respectively. The position of the substrate W on each of the hands H1, H2 can accurately be determined based on the four imaginary circles cr1 to cr4 and the position of the portion p5 on each of the hands H1, H2. The movement of the movement member 510, the rotation member 520, and the hands H1, H2 is controlled based on the determined position of the substrate W on each of the hands H1, H2. This results in improved accuracy in transporting the substrate W.

Errors sometimes occur between the actual positions and the designed positions of the detectors S1 to S5. The errors that occur for the detectors S1 to S4 deteriorate determination accuracy of the position of the substrate W. A degree to which the determination accuracy is deteriorated varies depending on the arrangement of the detectors S1 to S4.

Figure 9A:
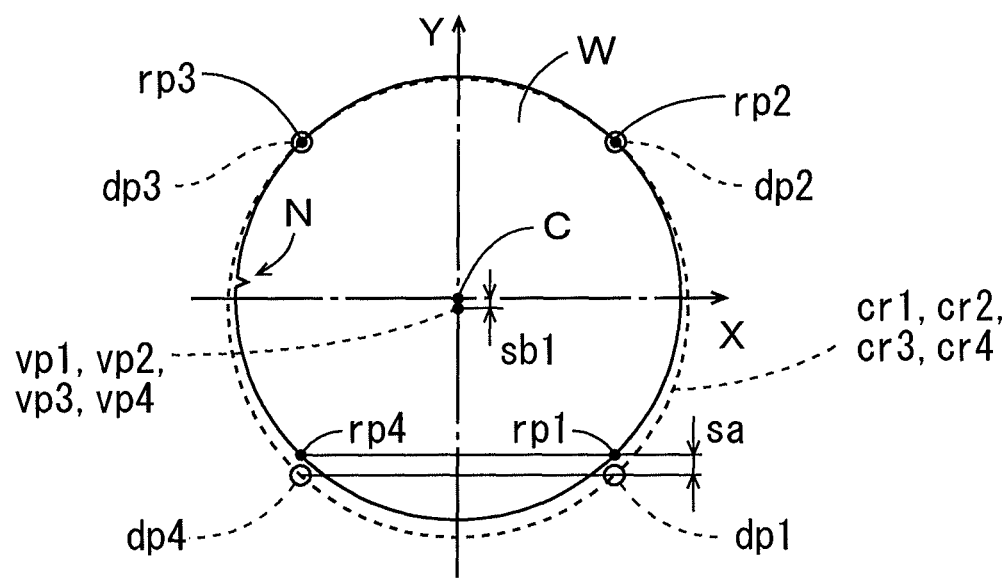
FIGS. 9A and 9B are schematic plan views for explaining relationships between arrangement of the plurality of detectors and a degree of deterioration in determination accuracy of the position of the substrate.
Figure 9B:
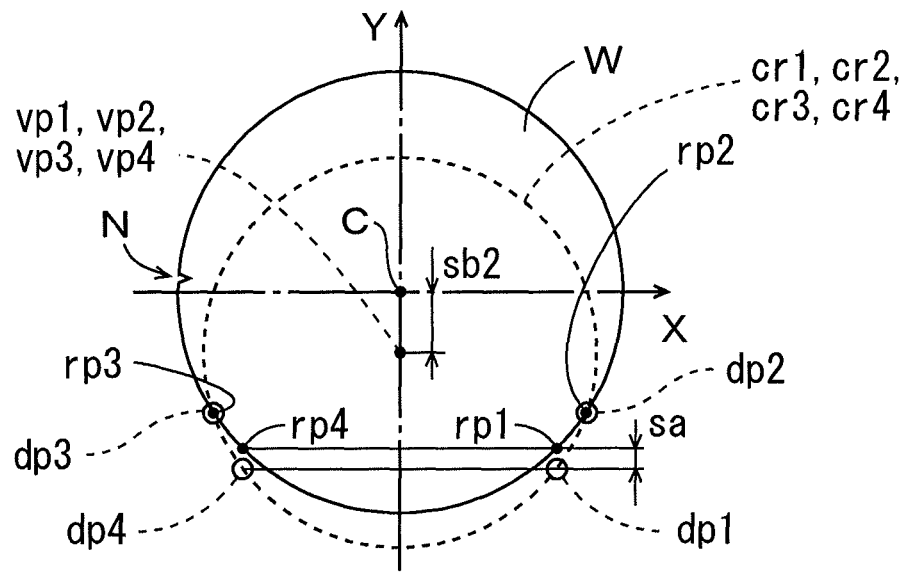

FIGS. 9A and 9B are schematic plan views for explaining relationships between the arrangement of the plurality of detectors S1 to S4 and the degree to which the determination accuracy of the position of the substrate W is deteriorated. Suppose a case where the detectors S1, S4 of FIG. 2 are attached to positions that are deviated by a micro-distance sa in a Y direction from inherent designed positions at which the detectors S1, S4 are to be attached. In this case, positions of the portions p1, p4 of the substrate W detected by the detectors 51, S4 differ from their actual positions. The actual positions of the portions p1 to p4 of the substrate W are hereinafter referred to as actual positions rp1 to rp4, and positions of the portions p1 to p4 of the substrate W detected in the state where the detectors S1, S4 are deviated by the micro-distance sa from the designed positions are hereinafter referred to as detection positions dp1 to dp4.

In the example of FIG. 9A, the detectors S1 to S4 are arranged to be positioned in the regions R1 to R4 of FIG. 2, respectively, during detection of the portions p1 to p4 of the substrate W, and also the detectors S1, S4 are deviated by the micro-distance sa from the designed positions.

In this case, the detection positions dp2, dp3 coincide with the actual positions rp2, rp3, respectively, while the detection positions dp1, dp4 are deviated by the micro-distance sa from the actual positions rp1, rp4, respectively, in the Y direction. Therefore, the center positions vp1 to vp4 of the imaginary circles cr1 to cr4 are deviated by a distance sb1 from the inherent center position C of the substrate W. As such, the determination accuracy of the position of the substrate W is deteriorated by the distance sb1.

In the example of FIG. 9B, the detectors S1, S2 are arranged to be positioned in the region R1 of FIG. 2 during detection of the portions p1, p2 of the substrate W, while the detectors S3, S4 are arranged to be positioned in the region R4 of FIG. 2 during detection of the portions p3, p4 of the substrate W, and also the detectors S1, S4 are deviated by the micro-distance sa from the designed positions.

In this case, similarly to the example of FIG. 9A, the detection positions dp2, dp3 coincide with the actual positions rp2, rp3, respectively, while the detection positions dp1, dp4 are deviated by the micro-distance sa from the actual positions rp1, rp4, respectively, in the Y direction. Therefore, the center positions vp1 to vp4 of the imaginary circles cr1 to cr4 are deviated by a distance sb2 from the inherent center position C of the substrate W. As such, the determination accuracy of the position of the substrate W is deteriorated by the distance sb2.

As shown in FIGS. 9A, 9B, the degree to which the determination accuracy is deteriorated (distance sb1) when the detectors S1 to S4 are arranged to be positioned in the regions R1 to R4, respectively, during detection of the portions p1 to p4 of the substrate W is smaller than the degree to which the determination accuracy is deteriorated (distance sb2) when the detectors S1, S2 are arranged to be positioned in the region R1 during detection of the portions p1, p2 of the substrate W while the detectors S3, S4 are arranged to be positioned in the region R4 during detection of the portions p3, p4 of the substrate W.

Thus, it is found that the deterioration of determination accuracy of the position of the substrate W due to the deviation of the positions of the detectors S1 to S4 is reduced by arranging the detectors S1 to S4 to be positioned in the regions R1 to R4, respectively, during detection of the portions p1 to p4 of the substrate W.

(8) Substrate Transport Device According to Second Embodiment

Figure 10:
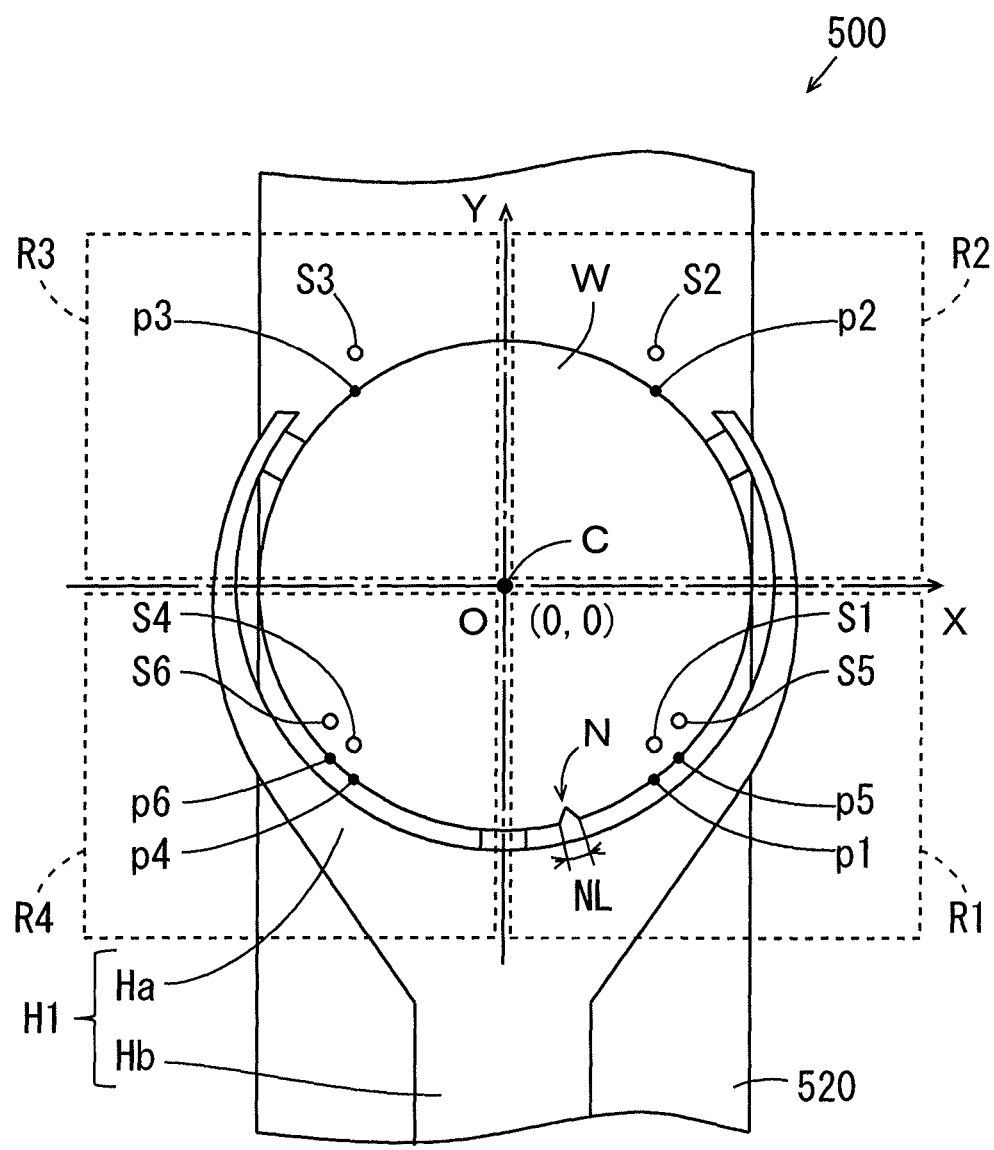
FIG. 10 is a partially enlarged plan view of a substrate transport device according to a second embodiment.

As for a substrate transport device according to a second embodiment, differences of the substrate transport device from the substrate transport device 500 according to the first embodiment will be described. FIG. 10 is a partially enlarged plan view of the substrate transport device according to the second embodiment. The partially enlarged plan view of FIG. 10 corresponds to the partially enlarged plan view of FIG. 2 according to the first embodiment.

As shown in FIG. 10, the substrate transport device 500 according to the second embodiment includes a detector S6 as well as the above-described detectors S1 to S5. The detector S6 is a transmission type photoelectric sensor having the same configuration as that of each of the detectors S1 to S5, and detects a portion in an outer periphery of a substrate W. The portion in the outer periphery of the substrate W detected based on a detection signal of the detector S6 is referred to as the portion p6 in the flowing explanation.

The detector S6 is fixed on the rotation member 520 so as to be positioned in the region R4 during detection of the portion p6 of the substrate W held by each of the hands H1, H2. In this example, the positions of the detectors S5, S6 are symmetrical with respect to the Y axis.

When the hand H1 retreats to the initial advance/retreat position or when the hand H1 advances from the initial advance/retreat position, the portion p6 of the substrate W is detected in the region R4 by the detector S6. The transport controller 550 of FIG. 3 can calculate a position of the portion p6 of the substrate W on the hand H1 based on the detection signal of the detector S6 and the output signal of the upper hand encoder 526. Similarly, the transport controller 550 can calculate a position of the portion p6 of the substrate W on the hand H2 based on the detection signal of the detector S6 and the output signal of the lower hand encoder 528.

In this embodiment, the portions p1 to p6 of the substrate W on the hand H1 are detected by the detectors S1 to S6, and a position of the substrate W on the hand H1 is determined based on the positions of the detected portions p1 to p6. Similarly, the portions p1 to p6 of the substrate W on the hand H2 are detected by the detectors S1 to S6, and a position of the substrate W on the hand H2 is determined based on the positions of the detected portions p1 to p6. A method of determining the position of the substrate W on the hand H1 will now be described.

First of all, the hand H1 holding the substrate W retreats to the initial advance/retreat position or advances from the initial advance/retreat position. Thus, the portions p1 to p6 of the substrate W are detected by the detectors S1 to S6, respectively. Positions of the portions p1 to p6 of the substrate W on the hand H1 are calculated based on the detection signals S1 to S6 of the detectors S1 to S6 and the output signal of the upper hand encoder 526 of FIG. 3. Also, in the X-Y coordinate system, four imaginary circles cr1 to cr4 that pass through three of the four positions of the portions p1, p2, p3, p4 are calculated, and center positions vp1 to vp4 of the four imaginary circles cr1 to cr4 are calculated, respectively. Further, a plurality of amounts of deviation among the four center positions vp1 to vp4 are calculated.

At this time, when the plurality of amounts of deviation are not more than a predetermined threshold value, the position of the substrate W on the hand H1 is determined based on any or all of the four imaginary circles cr1 to cr4 as explained in the first embodiment.

On the other hand, when at least one of the plurality of amounts of deviation exceeds the threshold value, a distance between each of the center positions vp1 to vp4 of the four imaginary circles cr1 to cr4 and the position of the portion p5 is calculated as a first distance. Also, a distance between each of the center positions vp1 to vp4 and the position of the portion vp6 is calculated as a second distance.

FIGS. 11A to 11D are plan views each showing a relationship between the first and second distances as for each of the imaginary circles cr1 to cr4 when at least one of the plurality of amounts of deviation exceeds the threshold value. In FIGS. 11A to 11D, positional relationships between the substrate W and the imaginary circles cr1, cr2, cr3, cr4 are individually shown in FIGS. 11A, 11B, 11C, and 11D together with the X axis and the Y axis. Furthermore, first and second distances dd1, dd2 are denoted by the two-dots and dashed lines in FIGS. 11A to 11D.

Figure 11A:
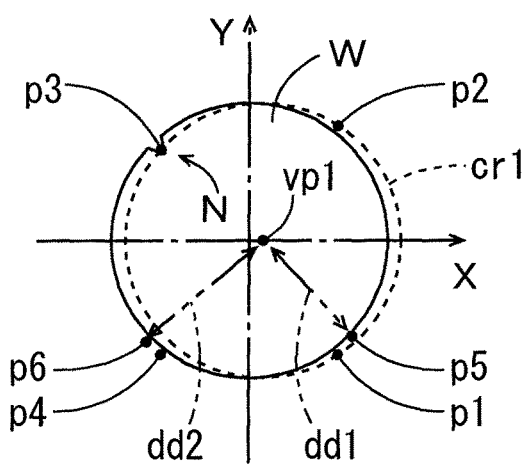
FIGS. 11A to 11D are plan views each showing a relationship between a first distance and a second distance for each imaginary circle when at least one of a plurality of amounts of deviation exceeds a threshold value.
Figure 11B:
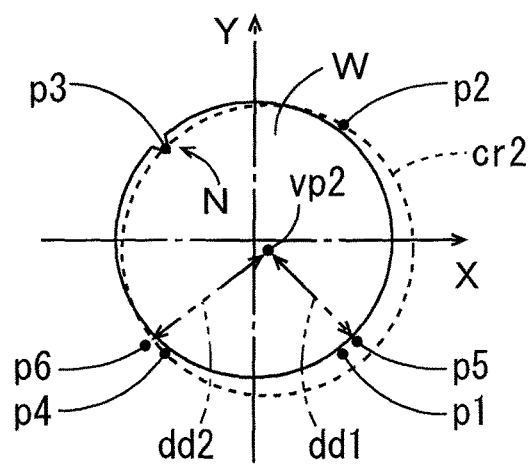
Figure 11C:
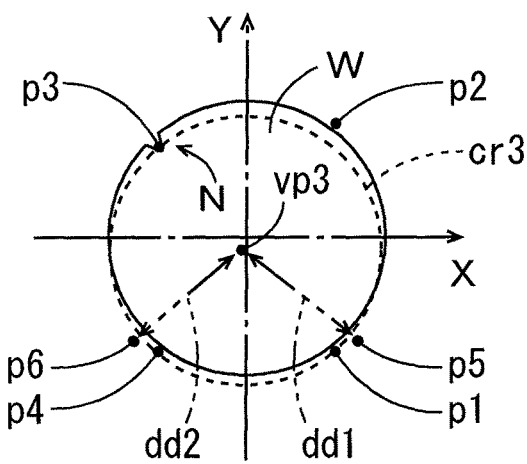
Figure 11D:
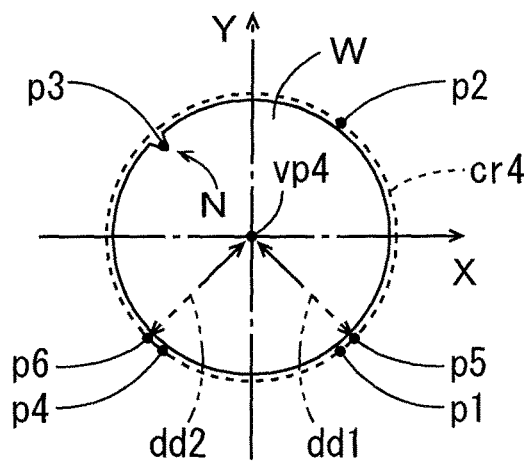

When at least one of the plurality of amounts of deviation exceeds the threshold value, a notch N is not present at the portion p5 or p6 of the substrate W detected by the detector S5 or S6. In this case, the imaginary circle representing the position of the substrate W on the hand H1 (imaginary circle cr4 in this example) passes through the positions of the portions p5, p6. As such, in the imaginary circle representing the position of the substrate W on the hand H1, the first and second distances dd1 and dd2 are equal to each other as shown in FIG. 11D. In addition, any one (portion p3 in this example) of the portions p1 to p4, at which the notch N is present, is positioned inside of the imaginary circle (circle cr4 in this example) representing the position of the substrate W on the hand H1.

Thus, an imaginary circle that has the equal first and second distances dd1 and dd2 and includes any one of the portions p1 to p4 which is positioned inside of the imaginary circle is selected among the imaginary circles cr1 to cr4. Also, the position of the substrate W on the hand H1 is determined based on the selected imaginary circle.

Figure 12:
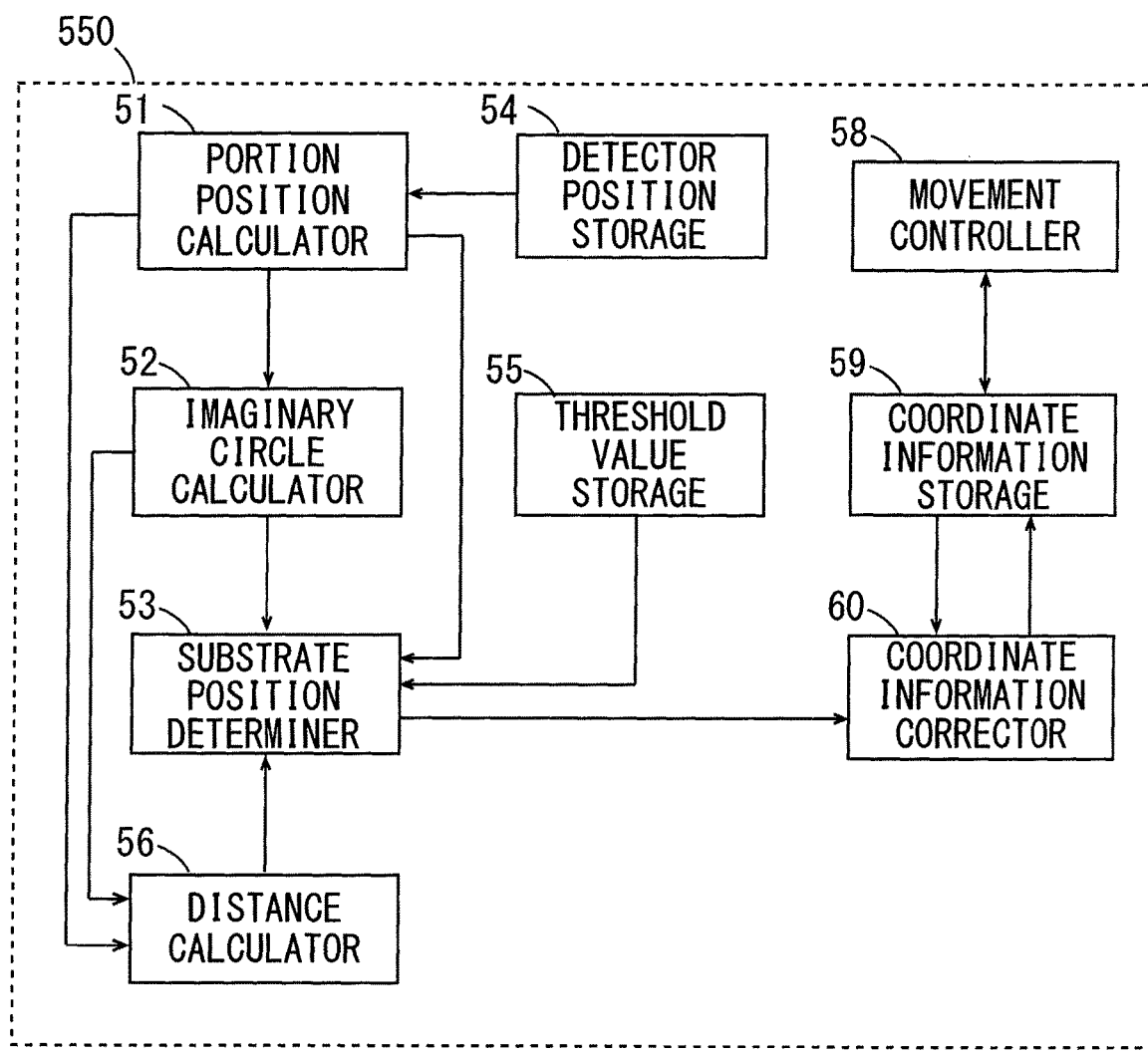
FIG. 12 is a block diagram showing a functional configuration of a transport controller according to the second embodiment.

FIG. 12 is a block diagram showing a functional configuration of the transport controller 550 according to the second embodiment. The transport controller 550 includes a distance calculator 56 in addition to the configuration of the transport controller 550 of FIG. 6. The distance calculator 56 calculates the first and second distances dd1, dd2 for each of the imaginary circles cr1 to cr4 calculated by the imaginary circle calculator 52 based on the positions of the portions p5, p6 calculated by the portion position calculator 51.

When all of the plurality of amounts of deviation among the center positions vp1 to vp4 of the imaginary circles cr1 to cr4 are not more than the threshold value stored in the threshold value storage 55, the substrate position determiner 53 determines the position of the substrate W on the hand H1 or H2 based on any or all of the four imaginary circles cr1 to cr4.

On the other hand, when at least one of the plurality of amounts of deviation exceeds the threshold value, the substrate position determiner 53 selects any one of the four imaginary circles cr1 to cr4, which has the equal first and second distances dd1, dd2 and includes any one of the portions p1 to p4, which is positioned inside of the selected one imaginary circle. After that, the substrate position determiner 53 determines the position of the substrate W on the hand H1 or H2 based on the selected one imaginary circle.

In this embodiment, the above-described calculation operation by the distance calculator 56 of FIG. 12 and the above-described determination operation by the substrate position determiner 53 of FIG. 12 are performed as the operation in step S12 of FIG. 8.

(9) Effects of Second Embodiment

In the substrate transport device 500 according to this embodiment, the first and second distances dd1, dd2 are calculated based on the four imaginary circles cr1 to cr4, which are calculated based on the positions of the portions p1 to p4 of the substrate W and the positions of the portions p5, p6 of the substrate W. An imaginary circle representing the position of the substrate W on the hand H1 or H2 can easily be selected based on the calculated first and second distances dd1, dd2. Thus, the position of the substrate W on the hand H1 or H2 can accurately be determined by simple processing.

(10) Configuration and Operation of Substrate Processing Apparatus

Figure 13:
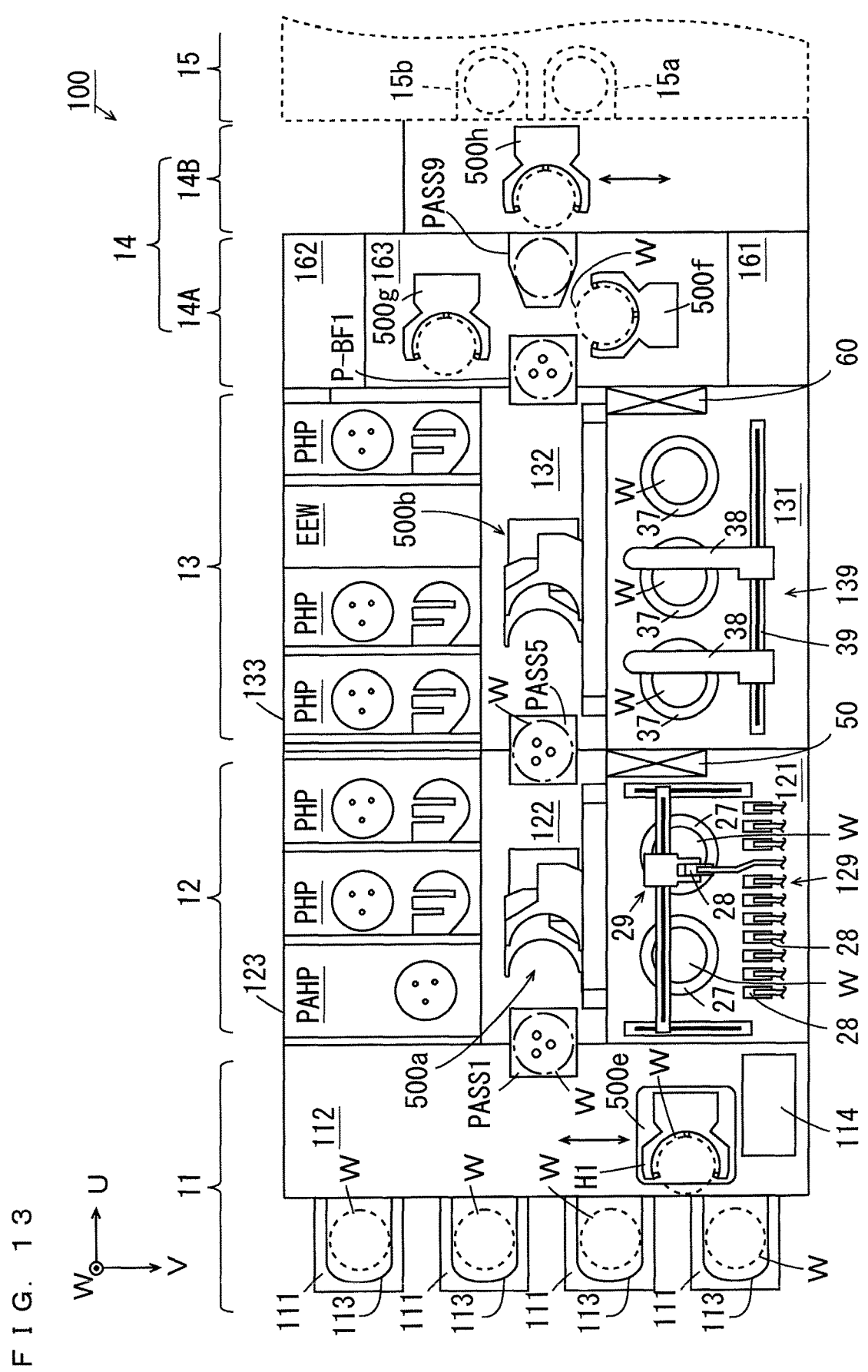
FIG. 13 is a schematic plan view of a substrate processing apparatus including the substrate transport device according to the first or second embodiment.

FIG. 13 is a schematic plan view of a substrate processing apparatus including the substrate transport device 500 according to the first or second embodiment. In FIG. 13 and the subsequent figures, the arrows indicating a U direction, a V direction, and a W direction that are orthogonal to one another are depicted to clarify positional relationships. The U direction and the V direction are orthogonal to each other in a horizontal plane, and the W direction corresponds to the vertical direction.

As shown in FIG. 13, a substrate processing apparatus 100 includes an indexer block 11, a first processing block 12, a second processing block 13, a cleaning drying block 14A, and a carry-in/out block 14B. The cleaning drying block 14A and the carry-in/out block 14B constitute an interface block 14. An exposure device 15 is arranged to be adjacent to the carry-in/out block 14B. The exposure device 15 performs exposure processing to a substrate W by a liquid immersion method.

The indexer block 11 includes a plurality of carrier platforms 111 and a transport section 112. A carrier 113 storing a plurality of substrates W in multiple stages is placed on each of the carrier platforms 111. The transport section 112 is provided with a main controller 114 and a substrate transport device (indexer robot) 500e. The main controller 114 controls various constituent elements of the substrate processing apparatus 100.

The first processing block 12 includes a coating processing section 121, a transport section 122, and a thermal processing section 123. The coating processing section 121 and the thermal processing section 123 are provided to be opposite to each other across the transport section 122. The second processing block 13 includes a coating development processing section 131, a transport section 132, and a thermal processing section 133. The coating development processing section 131 and the thermal processing section 133 are provided to be opposite to each other across the transport section 132.

The cleaning drying block 14A includes cleaning drying processing sections 161, 162 and a transport section 163. The cleaning drying processing sections 161, 162 are provided to be opposite to each other across the transport section 163. The transport section 163 is provided with substrate transport devices (transport robots) 500f, 500g. The carry-in/out block 14B is provided with a substrate transport device 500h. The substrate transport device 500h carries a substrate W into and out of the exposure device 15. The exposure device 15 is provided with a substrate inlet 15a for carrying in the substrate W and a substrate outlet 15b for carrying out the substrate W.

FIG. 14 is a side view mainly showing the transport sections 122, 132, 163 of FIG. 13. As shown in FIG. 14, the transport section 122 includes an upper transport chamber 125 and a lower transport chamber 126. The transport section 132 includes an upper transport chamber 135 and a lower transport chamber 136. A substrate transport device (transport robot) 500a is provided in the upper transport chamber 125, and a substrate transport device 500c is provided in the lower transport chamber 126. A substrate transport device 500b is provided in the upper transport chamber 135, and a substrate transport device 500d is provided in the lower transport chamber 136.

The substrate transport device 500a includes guide rails 501, 502, 503, a movement member 510, a rotation member 520, and hands H1, H2. The guide rails 501, 502 are each provided to extend in the vertical direction. The guide rail 503 is provided to extend in the horizontal direction (U direction) between the guide rails 501 and 502 and is attached to the guide rails 501, 502 to be movable in the vertical direction. The movement member 510 is attached to the guide rail 503 to be movable in the horizontal direction (U direction). The configuration of each of the substrate transport devices 500b to 500d is similar to that of the substrate transport device 500a.

The substrate transport device 500e of the transport section 112 has a hand H1 for holding the substrate W, and each of the substrate transport devices 500f, 500g of the transport section 163 of FIG. 13 and the substrate transport device 500h of FIG. 14 has hands H1, H2 for holding substrates W. The substrate transport device 500 according to the above-described first or second embodiment is used as each of the substrate transport devices 500a to 500h of the substrate processing apparatus 100 of FIGS. 13 and 14. The substrate controllers 550 (FIG. 3) of the substrate transport devices 500a to 500h are integrally controlled by the main controller 114 during a substrate transport operation. The operation unit 529 (FIG. 3) of each of the substrate transport devices 500a to 500h may be a common operation panel provided in the substrate transport device 500.

Substrate platforms PASS1, PASS2 are provided between the transport section 112 and the upper transport chamber 125, and substrate platforms PASS3, PASS4 are provided between the transport section 112 and the lower transport chamber 126. Substrate platforms PASS5, PASS6 are provided between the upper transport chamber 125 and the upper transport chamber 135, and the substrate platforms PASS7, PASS8 are provided between the lower transport chamber 126 and the lower transport chamber 136.

A placement buffer unit P-BF1 is provided between the upper transport chamber 135 and the transport section 163, and a placement buffer unit P-BF2 is provided between the lower transport chamber 136 and the transport section 163. A substrate platform PASS9 and a plurality of placement cooling units P-CP are provided to be adjacent to the carry-in/out block 14B in the transport section 163.

FIG. 15 is a schematic side view of the substrate processing apparatus 100 mainly showing the coating processing section 121, the coating development processing section 131, and the cleaning drying processing section 161 of FIG. 13.

As shown in FIG. 15, coating chambers 21, 22, 23, and 24 are hierarchically provided in the coating processing section 121. A coating unit (spin coater) 129 is provided in each of the coating chambers 21 to 24. Developing chambers 31, 33 and coating chambers 32, 34 are hierarchically provided in the coating development processing section 131. A developing unit (spin developer) 139 is provided in each of the coating chambers 31, 33, and a coating unit 129 is provided in each of the coating chambers 32, 34.

Each coating unit 129 includes a spin chuck 25 that holds a substrate W, and a cup 27 provided to cover the surroundings of the spin chuck 25. In this embodiment, two sets of spin chucks 25 and cups 27 are provided in each coating unit 129.

In each coating unit 129, the spin chuck 25 is rotated by a driving device not shown, and any of the plurality of processing liquid nozzles 28 (FIG. 13) is moved upward of the substrate W by a nozzle transport mechanism 29, and a processing liquid is discharged from the processing liquid nozzle 28. Thus, the processing liquid is applied onto the substrate W. Also, a rinse liquid is discharged from an edge rinse nozzle not shown to a periphery of the substrate W. Thus, the processing liquid adhering to the periphery of the substrate W is removed.

In the coating unit 129 of the coating chamber 22, 24, a processing liquid for anti-reflection film is supplied from the processing liquid nozzle 28 to a substrate W. Thus, an anti-reflection film is formed on the substrate W. In the coating unit 129 of the coating chamber 21, 23, a processing liquid for resist film is supplied from the processing liquid nozzle 28 to a substrate W. Thus, a resist film is formed on the substrate W. In the coating unit 129 of the coating chamber 32, 34, a processing liquid for resist cover film is supplied from the processing liquid nozzle 28 to a substrate W. Thus, a resist cover film is formed on the substrate W.

The developing unit 139 includes a spin chuck 35 and a cup 37 similarly to the coating unit 129. Also, as shown in FIG. 13, the developing unit 139 includes two development nozzles 38 that discharge a developing liquid, and a moving mechanism 39 that moves these development nozzles 38 in an X direction.

In the developing unit 139, the spin chuck 35 is rotated by a driving device not shown, and also, one of the development nozzles 38 supplies the developing liquid to each substrate W while moving in a U direction. After that, the other development nozzle 38 supplies the development liquid to each substrate W while moving. In this case, development processing for the substrate W is performed by supplying the development liquid to the substrate W.

Cleaning drying chambers 81, 82, 83, 84 are hierarchically provided in the cleaning drying processing section 161. A cleaning drying unit SD1 is provided in each of the cleaning drying chambers 81 to 84. In the cleaning drying unit SD1, a substrate W before exposure processing is cleaned and dried using a spin chuck not shown.

FIG. 16 is a schematic side view of the substrate processing apparatus 100 mainly showing the thermal processing sections 123, 133 and the cleaning drying processing section 162 of FIG. 13. As shown in FIG. 16, the thermal processing section 123 has an upper thermal processor 301 and a lower thermal processor 302. Each of the upper thermal processor 301 and the lower thermal processor 302 is provided with a plurality of heating units PHP, a plurality of adhesion reinforcing units PAHP, and a plurality of cooling units CP. Each heating unit PHP performs heating a substrate W. Each adhesion reinforcing unit PAHP performs adhesion reinforcing to improve adhesion between the substrate W and the anti-reflection film. Each cooling unit CP performs cooling the substrate W.

The thermal processing section 133 has an upper thermal processor 303 and a lower thermal processor 304. Each of the upper thermal processor 303 and the lower thermal processor 304 is provided with a cooling unit CP, a plurality of heating units PHP, and an edge exposure unit EEW. The edge exposure unit EEW performs exposure processing (edge exposure processing) to a region of a fixed width in a periphery of the resist film formed on the substrate W. Each heating unit PHP provided adjacent to the cleaning drying block 14A is configured to allow the substrate W to be carried in from the cleaning drying block 14A in the upper thermal processor 303 and the lower thermal processor 304.

Cleaning drying chambers 91, 92, 93, 94, 95 are hierarchically provided in the cleaning drying processing section 162. A cleaning drying unit SD2 is provided in each of the cleaning drying chambers 91 to 95. In the cleaning drying unit SD2, a substrate W after exposure processing is cleaned and dried using a spin chuck not shown.

An operation of the substrate processing apparatus 100 will be described with reference to FIGS. 13 to 16. A transport operation of a substrate W by the substrate transport devices 500a to 500h is performed during the operation of the substrate processing apparatus 100.

Each of the substrate platforms PASS1 to PASS9, the placement cooling units P-CP, the coating units 129, the developing units 139, the adhesion reinforcing units PAHP, the cooling units CP, the heating units PHP, the edge exposure units EEW, and the cleaning drying units SD1, SD2 corresponds to the one processing unit and the other processing unit as described above. Each processing unit has a supporter, and a receiving position and a placing position are set in the supporter. For example, in each of the coating units 129, the developing units 139, the edge exposure units EEW, and the cleaning drying units SD1, SD2, the spin chuck is the supporter, and the receiving position and the placing position are the center of rotation of the spin chuck. In each of the substrate platforms PASS1 to PASS9, three support pins are the supporter, and the receiving position and the placing position are the position of the center of the three support pins. In each of the placement cooling units P-CP, the adhesion reinforcing units PAHP, the cooling units CP, and the heating units PHP, a cooling plate or a heating plate is the supporter, and the receiving position and the placing position are the center of an upper surface of the cooling plate or the heating plate.

In FIG. 14, the carrier 113 storing unprocessed substrates W is placed on the carrier platform 111 of the indexer block 11 (FIG. 13) during the substrate transport operation. The substrate transport device 500e transports the unprocessed substrates W to the substrate platforms PASS1, PASS3 from the carrier 113. The substrate transport device 500e also transports processed substrates W placed on the substrate platforms PASS2, PASS4 to the carrier 113.

In the first processing block 12, the substrate transport device 500a transports a substrate W placed on the substrate platform PASS1 to the adhesion reinforcing unit PAHP (FIG. 16), the cooling unit CP (FIG. 16), and the coating chamber 22 (FIG. 15) in this order. Then, the substrate transport device 500a transports the substrate W, on which the anti-reflection film is formed by the coating chamber 22, to the heating unit PHP (FIG. 16), the cooling unit CP (FIG. 16), and the coating chamber 21 (FIG. 15) in this order. The substrate transport device 500a subsequently transports the substrate W, which has the resist film formed thereon by the coating chamber 21, to the heating unit PHP (FIG. 16) and the substrate platform PASS5 in this order. Further, the substrate transport device 500a transports a developed substrate W placed on the substrate platform PASS6 to the substrate platform PASS2.

The substrate transport device 500c transports a substrate W placed on the substrate platform PASS3 to the adhesion reinforcing unit PAHP (FIG. 16), the cooling unit CP (FIG. 16), and the coating chamber 24 (FIG. 15) in this order. Then, the substrate transport device 500c transports the substrate W, which has the anti-reflection film formed thereon by the coating chamber 24, to the heating unit PHP (FIG. 16), the cooling unit CP (FIG. 16), and the coating chamber 23 (FIG. 15) in this order. The substrate transport device 500c subsequently transports the substrate W, which has the resist film formed thereon by the coating chamber 23, to the heating unit PHP (FIG. 16) and the substrate platform PASS7 in this order. Further, the substrate transport device 500c transports a developed substrate W placed on the substrate platform PASS8 to the substrate platform PASS4.

In the second processing block 13, the substrate transport device 500b transports the substrate W, which has the resist film formed thereon and is placed on the substrate platform PASS5, to the coating chamber 32 (FIG. 15), the heating unit PHP (FIG. 16), the edge exposure unit EEW (FIG. 16), and the placement buffer unit P-BF1 in this order. Also, the substrate transport device 500b takes out the substrate W after exposure processing by the exposure device 15 and after thermal processing, from the heating unit PHP (FIG. 16) adjacent to the cleaning drying block 14A. The substrate transport device 500b transports the taken-out substrate W to the cooling unit CP (FIG. 16), the developing chamber 31 (FIG. 15), the heating unit PHP (FIG. 16), and the substrate platform PASS6 in this order.

The substrate transport device 500d transports the substrate W, which has the resist film formed thereon and is placed on the substrate platform PASS7, to the coating chamber 34 (FIG. 15), the heating unit PHP (FIG. 16), the edge exposure unit EEW (FIG. 16), and the placement buffer unit P-BF2 in this order. Also, the substrate transport device 500d takes out the substrate W after exposure processing by the exposure device 15 and after thermal processing, from the heating unit PHP (FIG. 16) adjacent to the cleaning drying block 14A. The substrate transport device 500d transports the taken-out substrate W to the cooling unit CP (FIG. 16), the developing chamber 33 (FIG. 15), the heating unit PHP (FIG. 16), and the substrate platform PASS8 in this order.

In the cleaning drying block 14A of FIG. 13, the substrate transport device 500f transports the substrate W placed on the placement buffer P-BF1, P-BF2 (FIG. 14) to the cleaning drying unit SD1 (FIG. 15) of the cleaning drying processing section 161. The substrate transport device 500f subsequently transports the substrate W from the cleaning drying unit SD1 to the placement cooling unit P-CP (FIG. 14). The substrate transport device 500g of FIG. 10 transports the substrate W after exposure processing, which is placed on the substrate platform PASS9 (FIG. 14) to the cleaning drying unit SD2 (FIG. 15) of the cleaning drying processing section 162. Also, the substrate transport device 500g transports the cleaned and dried substrate W from the cleaning drying unit SD2 to the heating unit PHP (FIG. 16) of the upper thermal processor 303 or the heating unit PHP (FIG. 16) of the lower thermal processor 304.

In the carry-in/out block 14B of FIG. 14, the substrate transport device 500h transports the substrate W before exposure processing, which is placed on the placement cooling unit P-CP to the substrate inlet 15a (FIG. 13) of the exposure device 15. Also, the substrate transport device 500h takes out the substrate after exposure processing from the substrate outlet 15b (FIG. 13) of the exposure device 15 and transports the taken-out substrate W to the substrate platform PASS9.

In the substrate processing apparatus 100, the position of the substrate W on the hand H1 or H2 is accurately determined during the transport of the substrate W by each of the substrate transport devices 500a to 500h. As such, even if the center position C of the substrate W is deviated from the reference position of the hand H1, H2 holding the substrate W, the substrate W can accurately be transported to the placing position based on the determined position of the substrate W on the hand H1, H2. Thus, processing accuracy of the substrate W by the processing units is improved.

(11) Other Embodiments (a) While the four detectors S1, S2, S3, S4 are positioned, respectively, in the four regions R1, R2, R3, R4 divided by the X axis and the Y axis during detection of the portions p1, p2, p3, p4 of the substrate W in the above-described embodiment, the present invention is not limited to this. The four detectors S1, S2, S3, S4 do not need to be positioned in the four regions R1, R2, R3, R4, respectively, during the detection of the portions p1, p2, p3, p4 of the substrate W. For example, the detectors S1, S2 may be disposed in the region R1, and the detectors S3, S4 may be disposed in the region R4.

(b) While the four imaginary circles cr1 to cr4 are calculated to determine the position of the substrate W on the hand H1, H2 in the above-described embodiment, five or more imaginary circles may be calculated to determine the position of the substrate W on the hand H1, H2. In this case, a certain number of new detectors for calculating imaginary circles corresponding to the number of imaginary circles for use in determination need to be provided in addition to the above-described detectors S1 to S6. Using five or more imaginary circles to determine the position of the substrate W makes it possible to more accurately determine the position of the substrate W on the hand H1, H2.

(c) The hand H1, H2 of the substrate transport device 500 may have a mechanism that abuts against an outer peripheral edge of the substrate W to hold the outer peripheral edge of the substrate W in place of the mechanism that sucks the lower surface of the substrate W in the above-described embodiment. As for the hand holding the outer peripheral edge of the substrate W, a portion of the hand that abuts against the outer peripheral edge of the substrate W is worn out, so that the substrate W may be held by the hand while the center position C of the substrate W is deviated from the reference position. Even in such a case, since the position of the substrate W on the hand is accurately determined, the substrate W can accurately be placed at a position at which the substrate W is inherently to be placed.

(d) While the light emitters Se of the plurality of detectors S1 to S6 emit light directed upward of the substrate W from the position downward of the substrate W in the above-described embodiment, the present invention is not limited to this. The light emitters Se of the plurality of detectors S1 to S6 may emit light directed downward of the substrate W from a position upward of the substrate W.

(e) While the light receivers Sr of the plurality of detectors S1 to S6 are arranged to receive transmitting light that is emitted from the plurality of light emitters Se to pass through a moving path of the substrate W as returning light in the above-described embodiment, the present invention is not limited to this. The plurality of light receivers Sr may be arranged to receive light that is emitted from the plurality of light emitters Se to be reflected on the moving path of the substrate W as returning light.

(f) While the plurality of portions p1 to p6 in the outer periphery of the substrate W held by the hand H1, H2 are detected by the optical detectors S1 to S6 in the above-described embodiment, the present invention is not limited to this. The plurality of portions p1 to p6 in the outer periphery of the substrate W held by each hand H1, H2 may be detected by a plurality of other detectors such as ultrasonic sensors.

(12) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-described embodiment, each of the substrate transport devices 500, 500a to 500h is an example of a substrate transport device, the rotation member 520 is an example of a movable element, the vertical direction drive motor 511, the horizontal direction drive motor 513, the rotational direction drive motor 515, and the movement member 510 are examples of a first driver, the hand H1, H2 is an example of a holder, and the drive motor for advancing/retreating an upper hand 525 or the drive motor for advancing/retreating a lower hand 527 is an example of a second driver.

The portions p1, p2, p3, p4, p5, p6 of the substrate W are an example of first, second, third, fourth, fifth, and sixth portions, respectively, in an outer periphery of a substrate, the detectors S1, S2, S3, S4, S5, S6 are an example of first, second, third, fourth, fifth, and sixth detectors, respectively, the transport controller 550 is an example of a transport controller, the portion position calculator 51 is an example of a portion position calculator, the imaginary circles cr1, cr2, cr3, cr4 are an example of four imaginary circles, the substrate position determiner 53 is an example of a position determiner, and the movement controller 58 is an example of a movement controller.

The Y axis is an example of a first imaginary line, the X axis is an example of a second imaginary line, the first distance dd1 is an example of a first distance, the second distance dd2 is an example of a second distance, the distance calculator 56 is an example of a distance calculator, the coordinate information is an example of control information, the coordinate information storage 59 is an example of a storage, the coordinate information corrector 60 is an example of a control information corrector, the substrate processing apparatus 100 is an example of a substrate processing apparatus, and each of the substrate platforms PASS1 to PASS9, the placement cooling unit P-CP, the coating unit 129, the developing unit 139, the adhesion reinforcing unit PAHP, the cooling unit CP, the heating unit PHP, the edge exposure unit EEW, and the cleaning drying unit SD1, SD2 is an example of a processing unit.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A substrate transport device that transports a substrate, comprising:
    a movable element;
    a first driver that moves the movable element;
    a holder that is configured to hold the substrate;
    a second driver that moves the holder with respect to the movable element;
    first, second, third, fourth, and fifth detectors that detect first, second, third, fourth, and fifth portions different from one another in an outer periphery of the substrate held by the holder; and
    a transport controller that controls the first and second drivers during transport of the substrate,
    wherein the transport controller includes
        a portion position calculator that calculates positions of the first, second, third, fourth, and fifth portions on the holder based on output signals of the first, second, third, fourth, and fifth detectors, respectively,
        an imaginary circle calculator that calculates four imaginary circles each passing through three of four positions of the first, second, third, and fourth portions calculated by the portion position calculator,
        a position determiner that determines a position of the substrate on the holder based on the four imaginary circles calculated by the imaginary circle calculator and the position of the fifth portion calculated by the portion position calculator, and
        a movement controller that controls the first and second drivers based on the position of the substrate determined by the position determiner.

2. The substrate transport device according to claim 1, wherein the holder has a predetermined reference position at which a center of the substrate is positioned when the substrate is held,
    a first imaginary line is defined, that is parallel to a moving direction of the holder with respect to the movable element and passes through the predetermined reference position,
    a second imaginary line is defined, that is orthogonal to the first imaginary line, passes through the predetermined reference position, and is parallel to the substrate held by the holder, and
    first, second, third, and fourth regions divided by the first imaginary line and the second imaginary line are defined, and
    the first, second, third, and fourth detectors are positioned in the first, second, third, and forth regions, respectively, during detection of the outer periphery of the substrate held by the holder.

3. The substrate transport device according to claim 1, wherein the position determiner calculates amounts of deviation among center positions of the four imaginary circles, and when at least one of a plurality of calculated amounts of deviation exceeds a predetermined threshold value, the position determiner selects one of the four imaginary circles based on the four imaginary circles and the position of the fifth portion and determines a position of the selected one imaginary circle as the position of the substrate on the holder.

4. The substrate transport device according to claim 3, wherein the position determiner determines the position of the substrate on the holder based on any or all of the four imaginary circles when all of the plurality of calculated amounts of deviation are not more than the predetermined threshold value.

5. The substrate transport device according to claim 1, further comprising a sixth detector that is provided to detect a sixth portion that is different from the first to fifth portions in the outer periphery of the substrate moved by the holder,
    wherein the portion position calculator further calculates a position of the sixth portion on the holder based on an output signal of the sixth detector when the holder moves with respect to the movable element,
    the transport controller further includes a distance calculator that calculates a distance between each center position of the four imaginary circles and the position of the fifth portion as a first distance, and calculates a distance between each of the center positions of the four imaginary circles and the position of the sixth portion as a second distance, and the position determiner calculates amounts of deviation among the center positions of the four imaginary circles, and when at least one of a plurality of calculated amounts of deviation exceeds a predetermined threshold value, the position determiner selects one of the four imaginary circles based on respective positions of the first, second, third, and fourth portions and a plurality of first distances and a plurality of second distances calculated by the distance calculator and determines a position of the selected one imaginary circle as a position of the substrate on the holder.

6. The substrate transport device according to claim 5, wherein the position determiner determines the position of the substrate on the holder based on any or all of the four imaginary circles when all of the plurality of calculated amounts of deviation are not more than the predetermined threshold value.

7. The substrate transport device according to claim 1, wherein the transport controller further includes
- a storage that stores control information for controlling the movement controller such that the holder places the substrate at a predetermined position, and
- a control information corrector that corrects the control information such that a deviation between a position of the substrate to be placed by the holder and the predetermined position is cancelled based on the position determined by the position determiner before the holder places the substrate at the predetermined position during the transport of the substrate, and
- the movement controller controls the first and second drivers based on the corrected control information.

8. A substrate processing apparatus that performs processing to a substrate, comprising:
- a processing unit having a supporter that supports the substrate and configured to perform processing to the substrate supported by the supporter; and
- the substrate transport device according to claim 1,
- wherein the movement controller of the substrate transport device controls the first and second drivers to transport the substrate to a predetermined position of the supporter in the processing unit.

9. A substrate transport method using a substrate transport device,
the substrate transport device including
a movable element,
a first driver that moves the movable element,
a holder that is configured to hold a substrate,
a second driver that moves the holder with respect to the movable element, and first, second, third, fourth, and fifth detectors that are provided to detect first, second, third, fourth, and fifth portions different from one another in an outer periphery of the substrate held by the holder,
the substrate transport method comprising the steps of:
calculating positions of the first, second, third, fourth, and fifth portions on the holder based on output signals of the first, second, third, fourth, and fifth detectors, respectively;
calculating four imaginary circles each passing through three of four positions of the calculated first, second, third, and fourth portions;
determining a position of the substrate on the holder based on the calculated four imaginary circles and the calculated position of the fifth portion; and
controlling the first and second drivers based on the determined position of the substrate.

* * * * *